(12) United States Patent
Norman

(10) Patent No.: US 6,408,402 B1
(45) Date of Patent: Jun. 18, 2002

(54) EFFICIENT DIRECT REPLACEMENT CELL FAULT TOLERANT ARCHITECTURE

(75) Inventor: Richard S. Norman, Sutton (CA)

(73) Assignee: Hyperchip Inc., Quebec (CA)

( * ) Notice: Subject to any disclaimer, the term of this patent is extended or adjusted under 35 U.S.C. 154(b) by 0 days.

(21) Appl. No.: 09/679,168

(22) Filed: Oct. 4, 2000

Related U.S. Application Data

(63) Continuation of application No. 09/376,194, filed on Aug. 18, 1999, now Pat. No. 6,154,855, which is a continuation of application No. 08/821,672, filed on Mar. 19, 1997, now Pat. No. 6,038,682, which is a continuation of application No. 08/618,397, filed on Mar. 19, 1996, now Pat. No. 5,748,872, which is a continuation of application No. 08/216,262, filed on Mar. 22, 1994, now abandoned.

(51) Int. Cl.[7] ............................................... H02H 3/05
(52) U.S. Cl. .......................... 714/10; 714/25; 714/29; 714/30; 714/48
(58) Field of Search ...................... 714/10, 48, 25, 714/30, 29

(56) References Cited

U.S. PATENT DOCUMENTS

| | | | | |
|---|---|---|---|---|
| 5,208,782 A | * | 5/1993 | Sakuta et al. ............... | 365/230 |
| 5,267,198 A | * | 11/1993 | Hatano et al. ......... | 365/189.01 |
| 5,276,648 A | * | 1/1994 | Yanagisawa et al. ....... | 365/201 |
| 5,402,377 A | * | 3/1995 | Ohhata et al. .............. | 365/200 |
| 5,748,872 A | * | 5/1998 | Norman ................. | 395/182.49 |
| 6,038,682 A | * | 3/2000 | Norman ....................... | 714/10 |
| 6,154,855 A | * | 11/2000 | Norman ....................... | 714/10 |

* cited by examiner

Primary Examiner—Norman M. Wright
(74) Attorney, Agent, or Firm—Cantor Colburn LLP

(57) ABSTRACT

A data processing system containing a monolithic network of cells with sufficient redundancy provided through direct logical replacement of defective cells by spare cells to allow a large monolithic array of cells without uncorrectable defects to be organized, where the cells have a variety of useful properties. The data processing system according to the present invention overcomes the chip-size limit and off-chip connection bottlenecks of chip-based architectures, the von Neumann bottleneck of uniprocessor architectures, the memory and I/O bottlenecks of parallel processing architectures, and the input bandwidth bottleneck of high-resolution displays, and supports integration of up to an entire massively parallel data processing system into a single monolithic entity.

32 Claims, 24 Drawing Sheets

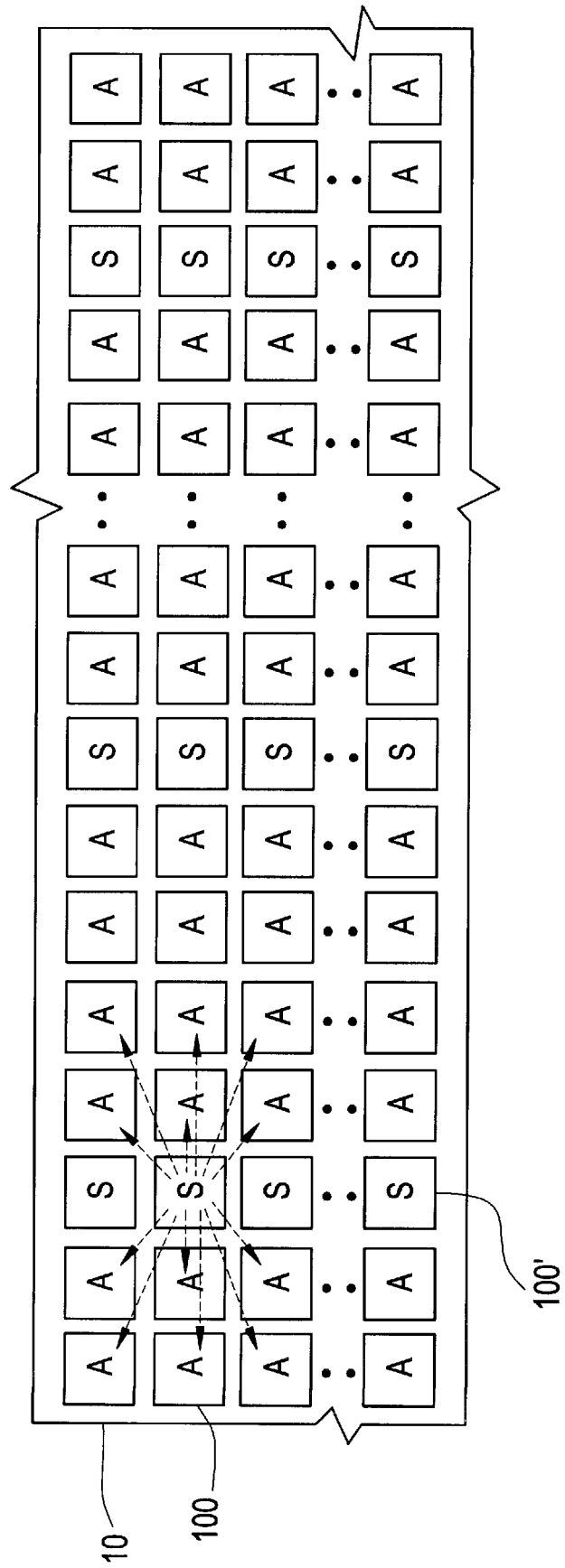

Typical Classic Architecture System (Data Flow)

Typical Classic Massively Parallel System (Data Flow)

NICE Architecture System
(Physical)
A single thin sheet with
thousands of indentical cells NICE Architecture System
(Data Flow)
No data flow bottlenecks

EFFICIENT DIRECT REPLACEMENT CELL FAULT TOLERANT ARCHITECTURE

This application is a continuation of U.S. application Ser. No. 09/376,194, now U.S. Pat. No. 6,154,855 filed on Aug. 18, 1999 entitled "Efficient Direct Replacement Cell Fault Tolerant Architecture" which is a continuation of U.S. application Ser. No. 08/821,672 now U.S. Pat. No. 6,038, 682, filed Mar. 19, 1997 entitled "A Fault Tolerant Data Processing System Fabricated on a Monolithic Substrate" which is a continuation of U.S. patent application Ser. No. 08/618,397 now U.S. Pat. No. 5,748,872 filed Mar. 19, 1996 entitled "Efficient Direct Replacement Cell Fault Tolerant Architecture" by Richard S. Norman which is a continuation of U.S. patent application Ser. No. 08/216,262 now abandoned filed Mar. 22, 1994 also entitled "Efficient Direct Replacement Cell Fault Tolerant Architecture."

BACKGROUND OF THE INVENTION

1. Field of the Invention

The present invention relates to improvements in data processing systems. More particularly, the invention is directed to eliminating performance bottlenecks and reducing system size and cost by increasing the memory, processing, and I/O capabilities that can be integrated into a monolithic region.

2. Description of Prior Art

Early computer circuits were made of separate components wired together on a macroscopic scale. The integrated circuit combined all circuit components (resistors, capacitors, transistors, and conductors) onto a single substrate, greatly decreasing circuit size and power consumption, and allowing circuits to be mass produced already wired together. This mass production of completed circuitry initiated the astounding improvements in computer performance, price, power and portability of the past few decades. But lithographic errors have set limits on the complexity of circuitry that can be fabricated in one piece without fatal flaws.

To eliminate these flaws large wafers of processed substrate are diced into chips so that regions with defects can be discarded. Improvements in lithography allow continually increasing levels of integration on single chips, but demands for more powerful and more portable systems are increasing faster still.

Portable computers using single-chip processors can be built on single circuit boards today, but because lithographic errors limit the size and complexity of today's chips, each system still requires many separate chips. Separate wafers of processor, memory, and auxiliary chips are diced into their component chips, a number of which are then encapsulated in bulky ceramic packages and affixed to an even bulkier printed circuit board to be connected to each other, creating a system many orders of magnitude bigger than its component chips. Using separate chips also creates off-chip data flow bottlenecks because the chips are connected on a macroscopic rather than a microscopic scale, which severely limits the number of interconnections. Macroscopic interchip connections also increase power consumption. Furthermore, even single board systems use separate devices external to that board for system input and output, further increasing system size and power consumption. The most compact systems thus suffer from severe limits in battery life, display resolution, memory, and processing power.

Reducing data traffic across the off-chip bottleneck and increasing processor-to memory connectivity through adding memory to processor chips is known in the art. Both Intel's new Pentium (tm) processor and IBM/Motorola/Apple's PowerPC (tm) 601 processor use 256-bit-wide data paths to small on-chip cache memories to supplement their 64-bit wide paths to their systems' external-chip main memories ("RISC Drives PowerPC", BYTE, August 1993, "Intel Launches a Rocket in a Socket", BYTE, May 1993). Chip size limits, however, prevent the amount of on-chip memory from exceeding a tiny fraction of the memory used in a whole system.

Parallel computer systems are well known in the art. IBM's 3090 mainframe computers, for example, use parallel processors sharing a common memory. While such shared memory parallel systems do remove the von Neumann uniprocessor bottleneck, the funneling of memory access from all the processors through a single data path rapidly reduces the effectiveness of adding more processors. Parallel systems that overcome this bottleneck through the addition of local memory are also known in the art. U.S. Pat. No. 5,056,000, for example, discloses a system using both local and shared memory, and U.S. Pat. No. 4,591,981 discloses a local memory system where each "local memory processor" is made up of a number of smaller processors sharing that "local" memory. But in these systems the local processor/memory clusters contain many separate chips, and while each processor has its own local input and output, that input and output is done through external devices. This requires complex macroscopic (and hence off-chip-bottleneck-limited) connections between the processors and external chips and devices, which rapidly increases the cost and complexity of the system as the number of processors is increased.

Massively parallel computer systems are also known in the art. U.S. Pat. Nos. 4,622,632, 4,720,780, 4,873,626, and 4,942,517, for instance, disclose examples of systems comprising arrays of processors where each processor has its own memory. While these systems do remove the von Neumann uniprocessor bottleneck and the multi-processor memory bottleneck for parallel applications, the processor/memory connections and the interprocessor connections are still limited by the off-chip data path bottleneck. Also, the output of the processors is still gathered together and funneled through a single data path to reach a given external output device, which creates an output bottleneck that limits the usefulness of such systems for output-intensive tasks. The use of external input and output devices further increases the size, cost and complexity of the overall systems.

Even massively parallel computer systems where separate sets of processors have separate paths to I/O devices, such as those disclosed in U.S. Pat. Nos. 4,591,980, 4,933,836 and 4,942,517 and Thinking Machines Corp.'s CM-5 Connection Machine (tm), rely on connections to external devices for their input and output ("Machines from the Lunatic Fringe", TIME, Nov. 11, 1991). Having each processor set connected to an external I/O device also necessitates having a multitude of connections between the processor array and the external devices, thus greatly increasing the overall size, cost and complexity of the system. Furthermore, output from multiple processors to a single output device, such as an optical display, is still gathered together and funneled through a single data path to reach that device. This creates an output bottleneck that limits the usefulness of such systems for display-intensive tasks.

Multi-processor chips are also known in the art. U.S. Pat. No. 5,239,654, for example, calls for "several" parallel processors on an image processing chip. Even larger numbers of processors are possible—Thinking Machines Corp.'s original CM-1 Connection Machine, for example, used 32 processors per chip to reduce the numbers of separate chips and off-chip connections needed for (and hence the size and cost of) the system as a whole (U.S. Pat. No. 4,709,327). The chip-size limit, however, forces a severe trade-off between number and size of processors in such architectures; the CM-1 chip used 1-bit processors instead of the 8-bit to 32-bit processors in common use at that time. But even for massively parallel tasks, trading one 32-bit processor per chip for 32 one-bit processors per chip does not produce any performance gains except for those tasks where only a few bits at a time can be processed by a given processor. Furthermore, these nonstandard processors do not run standard software, requiring everything from operating systems to compilers to utilities to be re-written, greatly increasing the expense of programming such systems. Newer massively parallel systems such as the CM-5 Connection Machine use standard 32-bit full-chip processors instead of multi-processor chips.

Input arrays are also known in the art. State-of-the-art video cameras, for example, use arrays of charge-coupled devices (CCD's) to gather parallel optical inputs into a single data stream. Combining an input array with a digital array processor is disclosed in U.S. Pat. No. 4,908,751, with the input array and processor array being separate devices and the communication between the arrays being shown as row-oriented connections, which would relieve but not eliminate the input bottleneck. Input from an image sensor to each processing cell is mentioned as an alternative input means in U.S. Pat. No. 4,709,327, although no means to implement this are taught. Direct input arrays that do analog filtering of incoming data have been pioneered by Carver Mead, et al., ("The Silicon Retina", Scientific American, May 1991). While this direct-input/analog filtering array does eliminate the input bottleneck to the array, these array elements are not suitable for general data processing. All these arrays also lack direct output means and hence do not overcome the output bottleneck, which is far more critical in most real world applications. The sizes of these arrays are also limited by lithographic errors, so systems based on such arrays are subjected to the off-chip data flow bottleneck. Reliance on connections to external output devices also increases the overall size, cost and complexity of those systems.

Output arrays where each output element has its own transistor are also known in the art and have been commercialized for flat-panel displays, and some color displays use display elements with one transistor for each color. Since the output elements cannot add or subtract or edit-and-pass-on a data stream, such display elements can do no data decompression or other processing, so the output array requires a single uncompressed data stream, creating a band-width bottleneck as array size increases. These output arrays also have no defect tolerance, so every pixel must be functional or an obvious "hole" will show up in the array. This necessity for perfection creates low yields and high costs for such displays.

Systems that use wireless links to communicate with external devices are also known in the art. Cordless data transmission devices, including keyboards and mice, handheld computer to desk-top computer data links, remote controls, and portable phones are increasing in use every day. But increased use of such links and increases in their range and data transfer rates are all increasing their demands for bandwidth. Some electromagnetic frequency ranges are already crowded, making this transmission bottleneck increasingly a limiting factor. Power requirements also limit the range of such systems and often require the transmitter to be physically pointed at the receiver for reliable transmission to occur.

Integrated circuits fabricated from amorphous and polycrystalline silicon, as opposed to crystalline silicon, are also known in the art. These substrates, though, are far less consistent and have lower electron mobility, making it difficult to fabricate fast circuits without faults. Since circuit speed and lithographic errors cause significant bottlenecks in today's computers, the slower amorphous and polycrystalline silicon integrated circuits have not been competitive with crystalline silicon in spite of their potentially lower fabrication costs.

Fault-tolerant architectures are also known in the art. The most successful of these are the spare-line schemes used in memory chips. U.S. Pat. Nos. 3,860,831 and 4,791,319, for example, disclose spare-line schemes suitable for such chips. In practice, a 4 megabit chip, for example, might nominally have 64 cells each with 64 k active bits of memory in a 256×256 bit array, while each cell physically has 260 bits by 260 bits connected in a manner that allows a few errors per cell to be corrected by substituting spare lines, thus saving the cell. This allows a finer lithography to be used, increasing the chip's memory density and speed. Since all bits in a memory chip have the same function, such redundancy is relatively easy to implement for memory. Processors, however, have large numbers of circuits with unique functions (often referred to in the art as random logic circuits), and a spare circuit capable of replacing one kind of defective circuit cannot usually replace a different kind, making these general spare-circuit schemes impractical for processors.

Redundancy schemes that handle random logic circuits by replicating every circuit are also known in the art. These incorporate means for selecting the output of a correctly functioning copy of each circuit and ignoring or eliminating the output of a faulty copy. Of these replication schemes, circuit duplication schemes, as exemplified by U.S. Pat. Nos. 4,798,976 and 5,111,060, use the least resources for redundancy, but provide the least protection against defects because two defective copies of a given circuit (or a defect in their joint output line) still creates an uncorrectable defect. Furthermore, it is necessary to determine which circuits are defective so that they can be deactivated. Many schemes therefore add a third copy of every circuit so that a voting scheme can automatically eliminate the output of a single defective copy. This, however, leads to a dilemma: When the voting is done on the output of large blocks of circuitry, there is a significant chance that two out of the three copies will have defects, but when the voting is done on the output of small blocks of circuitry, many voting circuits are needed, increasing the likelihood of errors in the voting circuits themselves! Ways to handle having two defective circuits out of three (which happens more frequently than the 2 defects out of 2 problem that the duplication schemes face) are also known. One tactic is to provide some way to eliminate defective circuits from the voting, as exemplified by U.S. Pat. No. 4,621,201. While this adds a diagnostic step to the otherwise dynamic voting process, it does allow a triplet with two defective members to still be functional. Another tactic, as exemplified by U.S. Pat. Nos. 3,543,048 and 4,849,657, calls for N-fold replication, where N can be raised to whatever level is needed to provide sufficient redundancy. Not only is a large N an inefficient use of space, but it increases the complexity of the voting circuits themselves, and therefore the likelihood of failures in them.

This problem can be reduced somewhat, although not eliminated, by minimizing the complexity of the voting circuits, as U.S. Pat. No. 4,617,475 does through the use of an analog differential transistor added to each circuit replicate, allowing a single analog differential transistor to do the voting regardless of how many replicates of the circuit there are. Yet another tactic is to eliminate the "voting" by replicating circuits at the gate level to build the redundancy into the logic circuit themselves. U.S. Pat. No. 2,942,193, for example, calls for quadruplication of every circuit, and uses an interconnection scheme that eliminates faulty signals within two levels of where they originate. While this scheme can be applied to integrated circuits (although it predates them considerably), it requires four times as many gates, each with twice as many inputs, as equivalent non-redundant logic, increasing the circuit area and power requirements too much to be practical. All these N-fold redundancy schemes also suffer from problems where if the replicates are physically far apart, gathering the signals requires extra wiring, creating propagation delays, while if the replicates are close together, a single large lithographic error can annihilate the replicates en masse, thus creating an unrecoverable fault.

Cell-based fault-tolerant architectures are also known in the art. U.S. Pat. Nos. 3,913,072 and 5,203,005, for example, both disclose fault-tolerant schemes that connect whole wafers of cells into single fault-free cell chains, even when a significant number of the individual cells are defective. The resulting one-dimensional chains, however, lack the direct addressability needed for fast memory arrays, the positional regularity of array cells needed for I/O arrays, and the two-dimensional or higher neighbor-to-neighbor communication needed to efficiently handle most parallel processing tasks. This limits the usefulness of these arrangements low or medium performance memory systems and to tasks dominated by one-dimensional or lower connectivity, such as sorting data. U.S. Pat. No. 4,800,302 discloses a global address bus based spare cell scheme that doesn't support direct cell-to-cell connections at all, requiring all communications between cells to be on the global bus. Addressing cells through a global bus has significant drawbacks; it does not allow parallel access of multiple cells, and comparing the cell's address with an address on the bus introduces a delay in accessing the cell. Furthermore, with large numbers of cells it is an inefficient user of power; in order for N cells to determine whether they are being addressed, each must check a minimum of log2(N) address bits (in binary systems), so an address signal requires enough power to drive N*log2(N) inputs. This is a high price in a system where all intercell signals are global.

Even cell-based fault-tolerant architectures that support two-dimensional connectivity are known in the art. U.S. Pat. No. 5,065,308 discloses a cell array that can be organized into a series of fault-free linear cell chains or a two-dimensional array of fault-free cells with neighbor-to-neighbor connections. Several considerations, however, diminish its applicability to large high-performance array at all but the lowest defect densities. While the cells can be addressed through their row and column connections IPN→OPS and IPE→OPW, this addressing is not direct in that a signal passing from West to East encounters two 3-input gates per cell, (even assuming zero-delay passage through the processor itself). Thus while large cells create high defect rates, small cells sizes create significant delays in the propagation of signals across the array. Consider, for example, a wafer with I defect per square centimeter, which is reasonable for a leading edge production technology. On a 5" wafer an 80 square centimeter rectangular array can be fabricated. Now consider what size cells might be suitable. With an 8 by 10 array of 1 cm square cells (less than half the size of a Pentium chip) the raw cell yield would be around 30%, or an average of 24 or 25 good cells. Only when every single column had at least one good cell, and that spaced by at most one row from the nearest good cell in each of the neighboring columns, could even a single 1×8 fault-free cell "array" could be formed. This should happen roughly 10% of the time, for an abysmal overall 1% array cell yield. With wafer scale integration, however, smaller cell sizes are useful as the cells do not have to be diced and reconnected. As cell size decreases, yields grow rapidly, but the propagation delays grow, too. With 5 mm square cells a 16×20 cell array would fit, and the raw cell yield would be almost 75%, so most arrays would have around 240 good cells. While an average column would have 15 good cells, it is the column with the fewest good cells that determine the number of rows in the final array. This would typically be 10 or 11 rows, creating 16×10 or 16×11 arrays. This would be a 50%–55% array cell yield, which is quite reasonable. But row-addressing signals propagated across the array would pass sequentially through up to 30 gates, creating far too long a delay for high-performance memory systems.

This interconnection scheme also has problems when used for processing cells, although it is targeted for that use. The cell bypassing scheme does support two-dimensional neighbor-to-neighbor connectivity, and could support a column-oriented bus for each column, but it cannot support a corresponding row-oriented bus without the 2-gate-per-cell delay. Three dimensional connectivity could be accomplished only by extending the bypass scheme to physically three dimensional arrays, which cannot be made with current lithography, and higher-dimensional connectivities such as hyper-cube connectivity are out of the question. Even for two-dimensional neighbor-to-neighbor connectivity, this scheme has certain drawbacks. While the row-oriented neighbor-to-neighbor connections never span a distance larger than one diagonal cell-center to cell-center, column-oriented neighbor-to-neighbor connections can be forced to span several defective or inactive cells. All intercell timing and power considerations must take into account the maximum capacitances and resistances likely to be encountered on such a path. This scheme also shifts the position of every cell in the entire rest of the column (relative to its same-logical-row neighbors) for each defective cell that is bypassed, which propagates the effects of each defective cell far beyond the neighborhood of the defect. This multi-cell shift also prevents this scheme from being useful in arrays where physical position of array cells is important, such as direct input or output cell arrays.

SUMMARY OF THE INVENTION

It is therefore one object of the present invention to provide a highly redundant network of cells that allows a large array of cells to be organized from a monolithically fabricated unit, with at least moderate yields of defect-free arrays in spite of significant numbers of defective cells, where all array cells can be directly addressed and have access to a global data bus, allowing the cell array to be used as a compact high-performance memory system.

It is another object of the present invention to provide a highly redundant network of cells that allows a large array of cells to be organized on a monolithically fabricated unit, with at least moderate yields of defect-free arrays in spite of significant numbers of defective cells, where all array cells have bi-directional communication with their neighboring array cells in at least 3 total dimensions (of which least two dimensions are physical) allowing the cell array to be efficiently used as a parallel processing system on massively parallel tasks of 3-dimensional or higher connectivity.

It is yet another object of the present invention to provide a highly redundant network of cells that allows a large array of cells to be organized on a monolithically fabricated unit, with at least moderate yields of defect-free arrays in spite of significant numbers of defective cells, where spare cells replacing defective cells are physically neighbors of the defective cells they replace, allowing the spare cells to act as direct replacements with little displacement in situations where physical location is important, such as video displays and direct input image processing arrays.

It is another object of the present invention to provide a cell-based fault-tolerant array containing sufficient redundancy to allow cells large enough to contain RISC (Reduced Instruction Set Computer) or CISC (Complex Instruction Set Computer) processors to be used while maintaining at least moderate yields on up to wafer-sized arrays.

It is further object of the present invention to provide a highly parallel or massively parallel data processing system that reduces data contention across the off-chip data bottleneck, and increases the number and/or width of data paths available between processors and memories, through the integration of all main memory and all processors into a single monolithic entity.

It is still another object of the present invention to provide an ultra-high-resolution display containing a monolithic array of cells where each cell has optical direct output means, and memory and processing means just sufficient to extract a datum from a compressed data stream and to transmit that datum through the direct output means, thus enabling the cells to be smaller than the obvious optical defect size with today's lithography.

It is a further object of the present invention to provide an serial or parallel data processing system where all lithographic components can be fabricated in the same monolithic region, allowing all lithographic components to be fabricated already connected, and also to be interconnected on a microscopic scale.

It is a further object of the present invention to provide an ultra-high-resolution display containing a monolithic array of cells where each cell has optical direct output means, and memory and/or processing capacity in excess of that which the cell needs to manage its direct outputs, allowing the array to perform other functions for the system as a whole, and thus increasing the fraction of a monolithically fabricated system that can be devoted to the display.

It is another object of the present invention to overcome the drawbacks in current parallel processing systems by providing a monolithic highly parallel or massively parallel data processing system containing an array of cells where each cell has direct output means, input means, and means for sufficient memory and processing to perform general data processing, allowing the array to handle a wide range of parallel processing tasks without processor, memory, off-chip, or output bottlenecks.

Another object of the present invention to provide a monolithic array of cells where each cell has direct input means, direct output means and means for memory and processing, allowing the array to communicate with external devices without physical connections to those devices.

A further object of the present invention is to provide a parallel data processing architecture that minimizes the distances between input, output, memory and processing means, allowing less power to be consumed and less heat to be generated during operation.

It is also an object of the present invention to provide a data processing system that dynamically focuses wireless transmissions to external devices to minimize bandwidth contention and power requirements through monolithically integrated dynamically focusing phased arrays.

It is another object of the present invention to provide a data processing architecture that reduces system design costs and simplifies the implementation of continuous manufacturing processes through the at-least-linear replication of all components.

It is another object of the present invention to provide a data processing architecture that maximizes system speed relative to component speed, thereby making practical the fabrication medium-performance systems from lower-cost, but slower, materials.

It is a further object of the present invention to provide a method for implementing any and all of the aforementioned objects of the present invention in single thin sheet.

In accordance with one aspect of the invention, there is thus provided an apparatus containing a monolithic redundant network of cells from which a large defect-free array of cells can be organized, where each array cell can be directly addressed and can receive and send data through a global data bus, allowing the combined memories of the array cells to be used as a single monolithic high performance, high capacity memory module.

In accordance with another aspect of the invention, there is thus provided an apparatus containing a monolithic redundant network of cells from which a large defect-free array of cells can be organized, where each array cell has direct bi-directional communication with its nearest neighbor cells in at least three total dimensions, at least two of which are physical, enabling the array as a whole to efficiently process parallel tasks of three-dimensional or higher neighbor-to-neighbor connectivity.

In accordance with yet another aspect of the invention, there is thus provided an apparatus containing a monolithic redundant network of cells from which a large defect-free array of cells can be organized, where all spare cells that replace defective cells to form the defect-free array are physical neighbors of the cells they replace, enabling the array to be used in situations where physical position is important, such as direct input or direct output image processing arrays.

In accordance with still another aspect of the invention, there is thus provided a data processing system containing a monolithic redundant network of cells interconnected in a manner such that at least three spare cells are capable of replacing the functions of any defective cell in organizing a defect free array, allowing cells large enough to support RISC or CISC processors to be used while maintaining at least moderate overall yields of defect-free arrays.

In accordance with a further aspect of the invention, there is thus provided a fault tolerant architecture that allows all lithographic components of a serial or parallel data processing system to be monolithically fabricated with high enough yields that all these components can be integrated into the same monolithic region with acceptable yields of the region as a whole, allowing all lithographic components to be fabricated already interconnected on a microscopic scale.

In accordance with a further aspect of the invention, there is thus provided an apparatus containing a monolithic redundant network of cells from which a large defect-free array of cells can be organized, with each array cell having direct optical output means and memory and/or processing means beyond what it needs to perform its display functions, allowing the array to perform functions for the system as a whole in addition to displaying data, and thus allowing the display array to occupy a larger fraction of a monothically fabricated region that contains means for those functions in addition to direct output means.

In accordance with a further aspect of the invention, there is thus provided an apparatus containing a monolithic redundant network of cells from which a large defect-free array of cells can be organized, with each array cell having access to a global input and having direct optical output means as well as minimal memory and processing means, allowing the array to receive, decompress and display data transmitted by another apparatus, such as a computer, a TV station or a VCR.

In accordance with another aspect of the invention, there is thus provided an apparatus containing a monolithic redundant network of cells from which a large defect-free array of cells can be organized, with each cell having means for communication with neighboring cells as well as direct optical output means and minimal memory and processing means, allowing the array to receive, decompress and display a large number of parallel input streams transmitted by another apparatus such as a computer or a VCR.

The present invention also provides, in another aspect, a data processing system containing a monolithic redundant network of cells from which a large defect-free array of cells can be organized, each cell having its own direct input means and direct output means as well as means for memory, means for processing and means for communication with neighboring cells, each cell being, in short, a complete miniature data processing system in its own right, as well as being part of a larger network, providing a highly parallel or massively parallel data processing system that overcomes the I/O and memory bottlenecks that plague parallel processors as well as the von Neumann bottleneck of single processor architectures, and eliminating physical interconnections between the processor/memory array and external input and output devices.

In accordance with still another aspect of the invention, there is thus provided a data processing system containing a monolithic redundant network of cells from which a large defect-free array of cells can be organized, where the array cells have direct inputs and/or direct outputs, and where spare cells have no direct I/O's of there own but use the direct inputs and outputs of the defective cells, allowing the surface of the network as a whole to be substantially covered with direct inputs and/or outputs in use by array cells.

In accordance with yet another aspect of the invention, there is thus provided a data processing system containing a monolithic redundant network of cells from which a large defect-free array of cells can be organized, where the array cells have fault-tolerant direct inputs and/or direct outputs, and where spare cells have no direct I/O's of their own but use the direct inputs and outputs of the defective cells, allowing the surface of the network as a whole to be substantially covered with direct inputs and/or outputs in use by array cells, without significant defects in the continuity of those direct inputs and/or outputs.

In accordance with still another aspect of the invention, there is thus provided a data processing system containing a monolithic redundant network of cells from which a large defect-free array of cells can be organized, each cell having direct input means and direct output means as well as means for memory, means for processing and means for communication with neighboring cells, where the whole network from which the array is organized can be produced by the at least linear replication of identical units, simplifying the fabrication of the array with continuous linear production.

In accordance with another aspect of the invention, there is thus provided a data processing system that uses a monolithic redundant network of cells from which a large defect-free array of cells can be organized to create a parallel data processing system that maximize s system speed relative to component speed, thus allowing systems with acceptable performance to be fashioned from lower-performance substrates such as amorphous or polycrystalline silicon.

The present invention also provides, in another aspect thereof, a method for producing any of the above arrays of cells where the entire array is fabricated as a single thin sheet.

By the expression "fault tolerant" as used herein is meant the ability to function correctly in spite of one or more defective components.

By the expression "data processing system" as used herein is meant a system containing means for input from an external device (such as a human operator), means for memory, means for processing, and means for output to an external device (such as a human eye).

By the expression "defect-free array" as used herein is meant an array of cells where all defective array cells have been logically replaced by correctly functioning spare cells.

By the expression "highly parallel" as used herein is meant a problem, a task, or a system with at least 16 parallel elements.

By the expression "massively parallel" as used herein is meant a problem, a task, or a system with at least 256 parallel elements.

By the expression "spare-line scheme" as used herein is meant a fault tolerant architecture that uses one or more spare rows and/or columns of units that can be used to logically replace one or more whole rows and/or columns of units that contain defective units.

By the expression "direct replacement" is meant that when a unit replaces a defective unit it interacts with the rest of system of which the units are a part in a manner logically identical to the way the defective unit would have had it not been defective.

By the expression "array" as used herein is meant elements arranged in a regular pattern of two or three physical dimensions, or as a regular two dimensional pattern on the surface of a three dimensional shape.

By the expression "large array of cells" as used herein is meant an array of cells that would, at the lithography with which it is made, and not considering spare cells, contain on the average a plurality of defective cells.

By t he expression "moderate yield" as used herein is meant a yield in excess of 50%.

By the expression "high yield" as used herein is meant a yield in excess of 90%.

By the expression "extremely high yield" as used herein is meant a yield in excess of 99%.

By the expression "single substrate system" as used herein is meant a data processing system of which all parts of are manufactured on a single substrate.

By the expression "direct output means" as used herein is meant means for a given cell to send an output signal to a device outside the array (such as a human eye) without that output signal being relayed through a neighboring cell, through a physical carrier common to that cell and other cells, or through a separate external output device.

By the expression "direct input means" as used herein is meant means for a given cell to receive an input signal from a device outside the array without that input signal being relayed through a neighboring cell, through a physical carrier common to that cell and other cells, or through a separate external input device.

By the expression "global input" as used herein is meant means for an individual cell to pick up an input signal from a physical carrier common to the cells, such as a global data bus.

By the expression "external output device" as used here in is meant an output device fabricated as a separate physical entity from the cell array.

By the expression "external input device" as used herein is meant an input device fabricated as a separate physical entity from the cell array.

By the expression "complementary direct input means and direct output means" as used herein is meant that the direct input means and direct output means of two identical devices with such means could communicate with each other through such means.

By the expression "means for communication with neighboring cells" as used herein is meant input means to receive a signal from at least one neighboring cell and output means to send a signal to at least one other neighboring cell without the signals being relayed through a carrier shared with other array cells or through an external device.

By the expression "full color" as used herein is meant the ability to display or distinguish at least 50,000 different hues (approximately as many shades as the average unaided human eye is capable of distinguishing).

By the expression "full motion video" as used herein is meant the ability to display at least 50 frames per second (the approximate rate beyond which the average unaided human eye notices no improvement in video quality).

By the expression "macroscopic" as used herein is meant something larger than the resolving power of the average unaided human eye, or larger than 50 microns.

By the expression "microscopic" as used herein is meant something smaller than the resolving power of the average unaided human eye, or smaller than 50 microns.

By the expression "thin sheet" as used herein is meant a sheet whose total thickness is less than 1 centimeter.

By the expression "regional" as used herein is meant something common to or associated with a plurality of cells in a region of the network of cells that is smaller than the entire network.

By the expression "directly addressable" as used herein is meant that a cell can be addressed through a single off/on signal for each physical array dimension, without any of these addressing signals being relayed through other cells.

By the expression "total dimensions" as used herein is meant the number of physical dimensions plus the number of logical dimensions; a 65,536 processor CM-1 Connection Machine computer, for example, has its processors connected in a hypercube of 16 total dimensions, three of which are physical and 13 of which are logical.

By the expression "physical connection" as used herein is meant a connection that relies on physical contact or submicron proximity.

By the expression "monolithic" as used herein is meant a contiguous region of a substrate.

By the expression "phased array" as used herein is meant an array whose elements individually control the phase or timing of their component of a signal that the array as a whole emits or receives.

By the expression "dynamic focusing" as used herein is meant a focusing process whose focal length and/or direction are not predetermined, but are adjusted during operation to focus on a device.

By the expression "N-fold replication" as used herein is meant that N functionally identical copies of a given unit are fabricated for each copy of that unit that is needed an operational system.

By the expression "N-for-1 redundancy" as used herein is meant that in the absence of errors any one of N units can fulfill the functions of a given unit.

By the expression "physical neighbors" is meant that the minimum distance between two cells is less than twice the width of a cell in that direction.

The expression "could be produced with identical lithographic patterns" is used solely to describe the similarity of the structures and is not to be construed as limiting the invention to embodiments produced with lithography.

BRIEF DESCRIPTION OF THE DRAWINGS

These and other objects, features and advantages of the invention will be more readily apparent from the following detailed description of the preferred embodiments of the invention in which:

FIG. 1H is a functional depiction of an array of processing cells with only one column of spare cells for every four columns of array cells, yet with means for any of three spare cells to take over for any defective array cell;

DESCRIPTION OF THE PREFERRED EMBODIMENT

Direct Replacement Cell Fault Tolerant Architecture

Figure 1A:
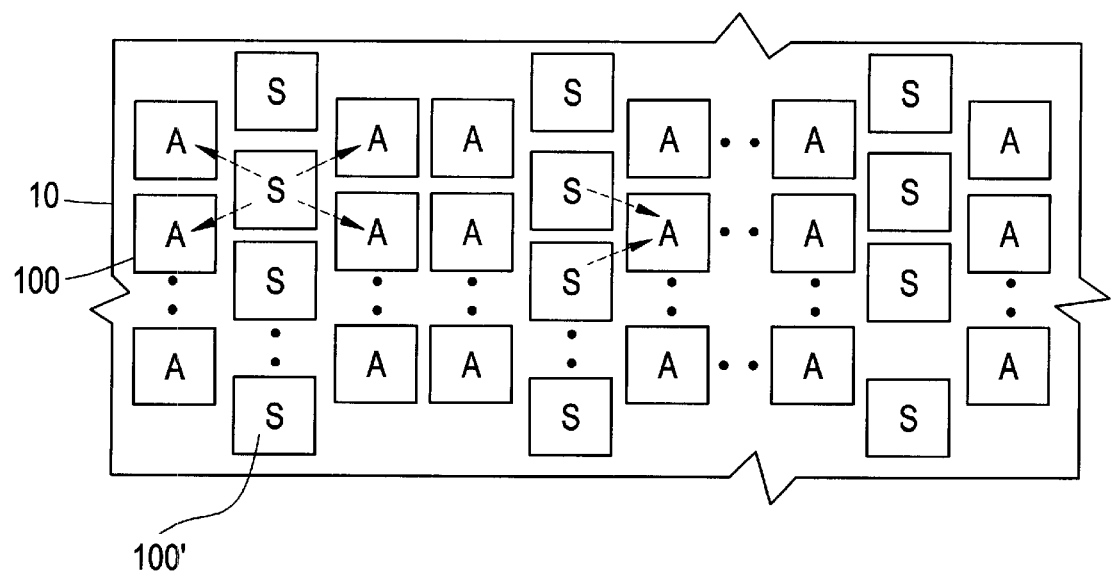
FIG. 1A is a functional depiction of an array of processing cells with means for any of two spare cells to take over for any defective cell.

Because lithographic errors limit the size of traditional chips, chip-based computer architectures use many separate chips for processing, memory and input/output control. A number of these separate processor, memory, and auxiliary chips are encapsulated in bulky ceramic packages and affixed to even bulkier printed circuit boards to connect to each other. A svelte processor chip like IBM/Apple/Motorola's PowerPC 601, for example, uses a ceramic holder 20 times its own size to allow it to be connected to a still-larger circuit board. While each chip use wires fabricated on a microscopic scale (on the order of 1 micron) internally, the board-level interconnections between the chips use wires fabricated on a macroscopic scale (on the order of 1 millimeter, or 1000 times as wide). Because of this chip-based architectures not only suffer from the expense of dicing wafers into chips then packaging and interconnecting those chips, and the corresponding bulk this creates, but also from limits in the number of connections that can be made between any given chip and the rest of the system. Once the chip-size limit is exceeded, the number of possible connections to the rest of the system drops by over 3 orders of magnitude, and the power required to drive each connection climbs markedly.

Several attempts to extend or overcome this lithographic chip-size-limit are known in the prior art. For small highly repetitive circuits, generic replacement fault tolerant schemes are useful. The most commercially successful of these is the fabrication of extra bit and word lines on memory chips. A 4 megabit chip, for example, might nominally be composed of 64 cells of 64 k-bits each, while in order to increase the likelihood of having all 64 cells functional, each cell physically has 260 bit lines and 260 word lines instead of the 256×256 that are needed for 64 k bits. The spare lines are connected to the standard lines through a complex series of fuses so that they can act as direct replacements for individual faulty lines. This line-level redundancy allows a cell to recover from a few faulty bits, so a finer lithography more prone to small lithographic errors can be used without reducing the chip size limit. But large lithographic errors can span many lines, and this redundancy scheme does nothing to address such errors, so the overall chip size limit is not increased much. Furthermore, generic replacement fault tolerant schemes such as this do not support two-dimensional or higher neighboring unit to neighboring unit connectivity, and only work with small, highly repetitive circuits. Processors have large numbers of random logic circuits, and a spare circuit capable of replacing one kind of defective circuit cannot usually replace a different kind, making such general spare-circuit schemes impractical for processors.

Redundancy schemes that handle random logic circuits by replicating every circuit are also known in the art. These incorporate means for selecting the output of a correctly functioning copy of each circuit and ignoring or eliminating the output of a faulty copy. Of these replication schemes, circuit duplication schemes use the least resources for redundancy, but can be disabled by two defective copies of a single circuit or a single defect in their joint output line. Many schemes therefore add a third copy of every circuit so that a voting scheme can automatically eliminate the output of a single defective copy. This, however, leads to a dilemma: When the voting is done on the output of large blocks of circuitry, there is a significant chance that two out of the three copies will have defects, but when the voting is done on the output of small blocks of circuitry, many voting circuits are needed, increasing the likelihood of errors in the voting circuits themselves! Ways to handle having two defective circuits out of three (which occurs more frequently than the two-defects-out-of-two problem that the duplication schemes face) are also known. One tactic is to provide some way to eliminate defective circuits from the voting. While this does add a diagnostic step to the otherwise dynamic voting process, it does allow a triplet with two defective members to still be functional. Another tactic calls for N-fold replication, where N can be raised to whatever level is needed to provide sufficient redundancy. Not only is a large N an inefficient use of space, but it increases the complexity of the voting circuits themselves, and therefore the likelihood of failures in them. This problem can be reduced somewhat by minimizing the complexity of the voting circuits (through analog circuits, for example), or eliminated at great expense in circuit area and power through gate-level N-fold redundancy. Also, when these N-fold schemes use small units to enable a lower value of N to be used, a problem arises where if the replicates are physically far apart, gathering the signals requires significant extra wiring, creating propagation delays; while if the replicates are close together, a single large lithographic error can annihilate the replicates en masse, thus creating an unrecoverable fault.

Cell-based fault-tolerant architectures other than N-fold replication are also known in the art, but they do not support some of the most important features for general data processing—the direct addressability needed for fast memory arrays, the positional regularity of array cells needed for I/O arrays, and the higher than two-dimensional neighbor-to-neighbor communication needed to efficiently handle many real-world parallel processing tasks.

Figure 1B:
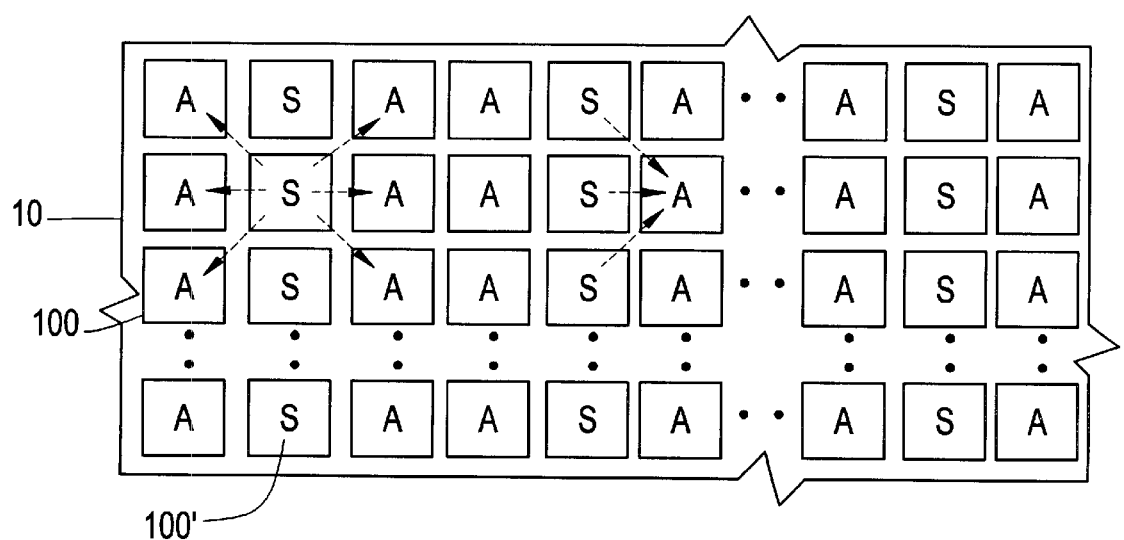
FIG. 1B is a functional depiction of an array of processing cells with means for any of three spare cells to take over for any defective cell.
Figure 1C:
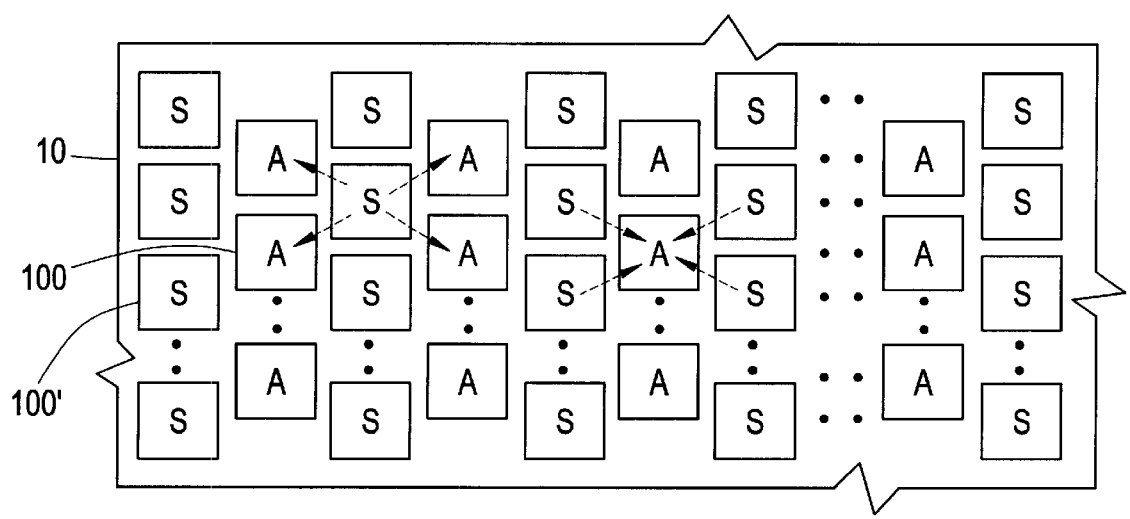
FIG. 1C is a functional depiction of an array of processing cells with means for any of four spare cells to take over for any defective cell.
Figure 1D:
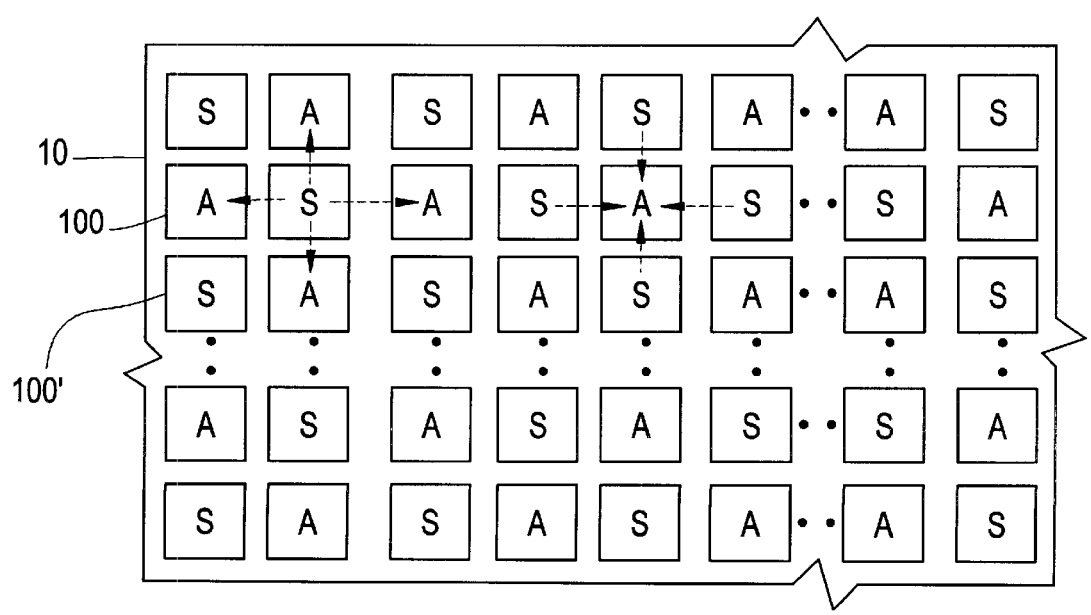
FIG. 1D is a functional depiction of another array of processing cells with means for any of four spare cells to take over for any defective cell.

Accordingly, the fault tolerant data processing architecture according to one embodiment of the present invention overcomes this chip-size limit bottleneck with a monolithic network of cells with sufficient redundancy that a large fault-free array of cells can be organized where the array cells have a variety of attributes useful for data processing, including the direct addressability needed for fast memory arrays, the positional regularity of array cells needed for I/O arrays, and the higher than two-dimensional neighbor-to-neighbor communication needed to efficiently handle many real-world parallel processing tasks, and provides spare cells within the network interconnected in such a manner that a plurality of spare cells can directly replace the functions of any given array cell should that array cell prove defective, without the overhead of a plurality of dedicated replacements for each cell. This can be achieved by providing each spare cell with the ability to serve as a direct replacement for any one of a plurality of potentially defective neighboring array cells, in such a manner that the spare cells' replacement capabilities overlap. In this way an exceptional level of redundancy, and hence extremely high fault tolerance, can be provided relatively from few spare cells. The simplest way for a spare cell to serve as a direct replacement for an array cell is for the spare cell to have identical internal functions, or a superset thereof, and to have direct replacements for every connection the array cell uses in normal operation has (it is possible to have "spare" cells and "array" cells be identical, although when a given spare cell can replace any one of a plurality of array cells this requires that some of the connections be idle in normal operation as an array cell). FIG. 1A shows an example of such an interconnection scheme where the network 10 of cells contains a column of spare cells 100' for every two columns of array cells 100. From a spare cell's point of view, each spare cell (except those on the edges of the array) can take over for any one of its four nearest neighbor array cells, while from an array cell's point of view, there are two spare cells that can take over for any given defective array cell. In FIG. 1B, three spare cells are able to replace any defective array cell; while in FIG. 1C, four nearest neighbor spare cells can take over for any given defective array cell (this can also be done with a checkerboard pattern of array cells and spare cells, as shown in FIG. 1D).

Figure 1E:
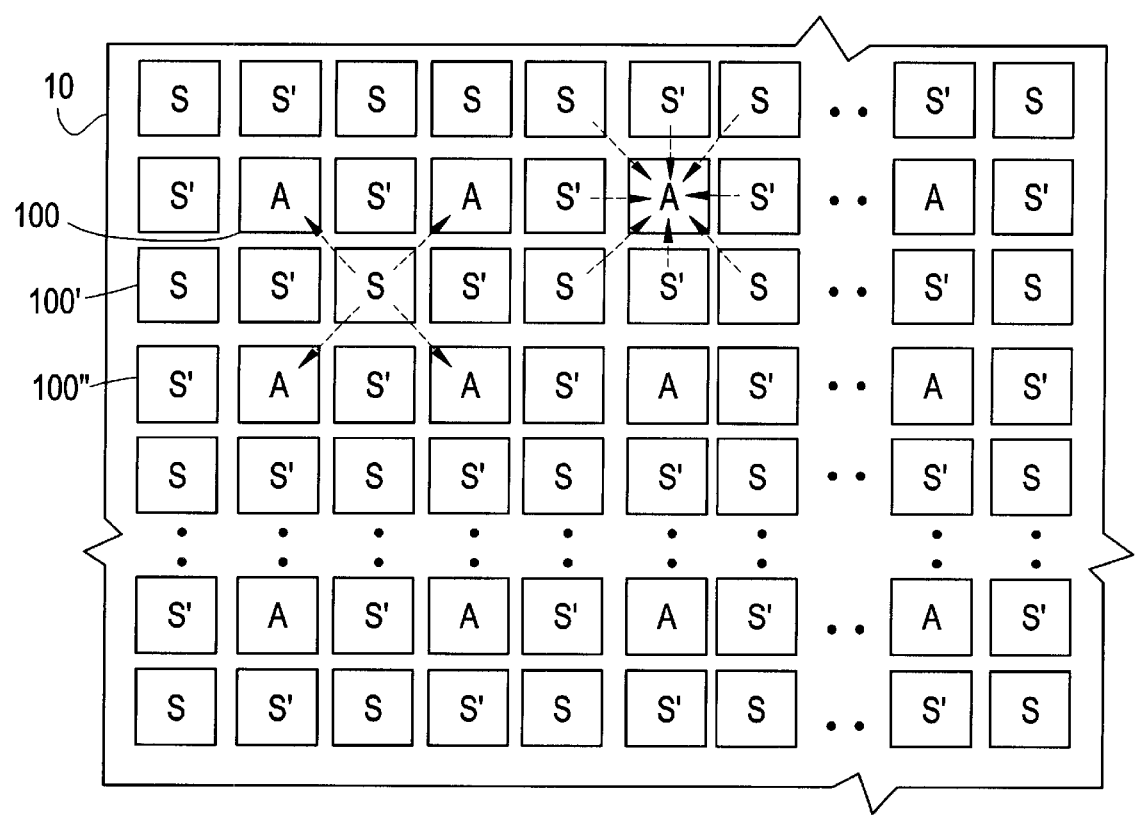
FIG. 1E is a functional depiction of another array of processing cells with means for any of eight spare cells to take over for any defective cell.

This type of scheme creates an extremely error-tolerant system, which is of critical importance in allowing a large array of cells to be fabricated as a single unit. When pushing the limits of lithography it is not uncommon to average 200 errors per 5" wafer. Under such conditions an implementation that allows any of three spare cells to take over for any defective cell will increase yields of a full-wafer network with 1000 cells per square inch from near zero to over 99.99%. For larger cells, such as those containing RISC or CISC processors, the 5-for-1 schemes of FIGS. 1C and 1D provides sufficient redundancy for similar yields for wafer-sized arrays of cells up to a few millimeters on a side even with error-prone leading edge lithography. With cells interconnected on a microscopic level there is no off-chip bottleneck to limit intercell connections, so this spare cell scheme can easily be extended to provide more redundancy by providing the ability for each spare cell to replace array cells in a wider area should one of those array cells prove defective. As the raw cell yield drops, however, it is necessary to add a rapidly increasing percentage of spare cells to the network to avoid spare-cell depletion. A 9-for-1 spare cell scheme where only ¼ of the cells are array cells, as shown in FIG. 1E, can maintain at least moderate array yields with raw cell yields as low as 50% on a 64-cell array.

Because all intercell connections are at a microscopic level, and because replacement cells are physically close to the cells they can replace, cells can devote enough interconnections to redundancy to support N-for-1 replacement schemes where N is very large. For a given arrangement of spare and array cells, the average distance from a cell to a spare cell that can replace it in a two dimensional N-for-1 replacement scheme is approximately proportional to the square root of N. For row and column direct addressing, row and column data busses, etc., the number of paths a spare cell needs in an N-for-1 replacement scheme also grows approximately with the with the square root of N because with large N's more of the cells it can replace will lie on the same row or column. For arrays with direct interprocessor communications, the number of paths per spare cell is proportional to N because dedicated paths are used to each cell. Even when both types of connections are used, N can be very large. A Pentium-sized cell, for example, has a circumference of over 60,000 microns, and a leading edge (0.5 micron, 5 metal layer) production line can easily devote 2 metal layers to redundancy. This allows a Pentium-sized cell to have 480 64-bit-wide paths across it in the redundancy layers. A typical array cell might use 4 such row/column paths for row/column addressing and busses, and 6 cell-cell paths for neighbors in a three dimensional (two physical, one logical) neighbor-neighbor network. The spare cell connections would take approximately $4*N+6*N*\sqrt{(N/2)}$ equivalent paths, allow N to be as large as 20 or so for Pentium-sized cells with today's lithography, even with 64-bit interconnections throughout. This would theoretically support raw cell yields down to 20% for an 8-to-1 spare/array cell ratio, or even down to 10% with a 15-to-1 spare/array cell ratio, with reasonable yields of defect free arrays. But because low raw-cell yields decrease the percentage of the wafer area used by good cells, and because monolithic architectures can use smaller cells than chip-based architectures due to the elimination of dicing and reconnecting, it is expected that in practice cell sizes will be picked relative to lithographic error rates to keep raw cell yields above 90% in most cases and above 50% in virtually all cases.

Figure 1F:
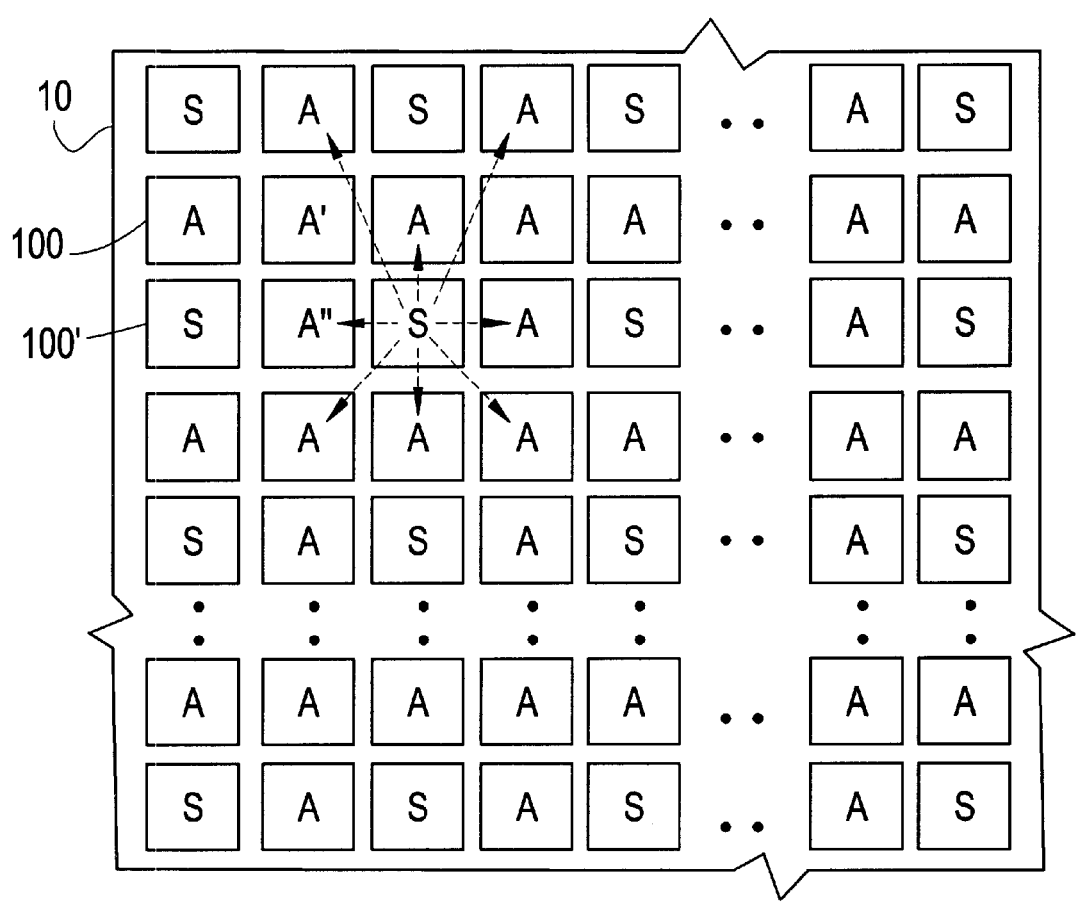
FIG. 1F is a functional depiction of an array of processing cells with only one spare cell for every three array cells, yet with means for any of 3 spare cells to take over for any defective array cell.
Figure 1G:
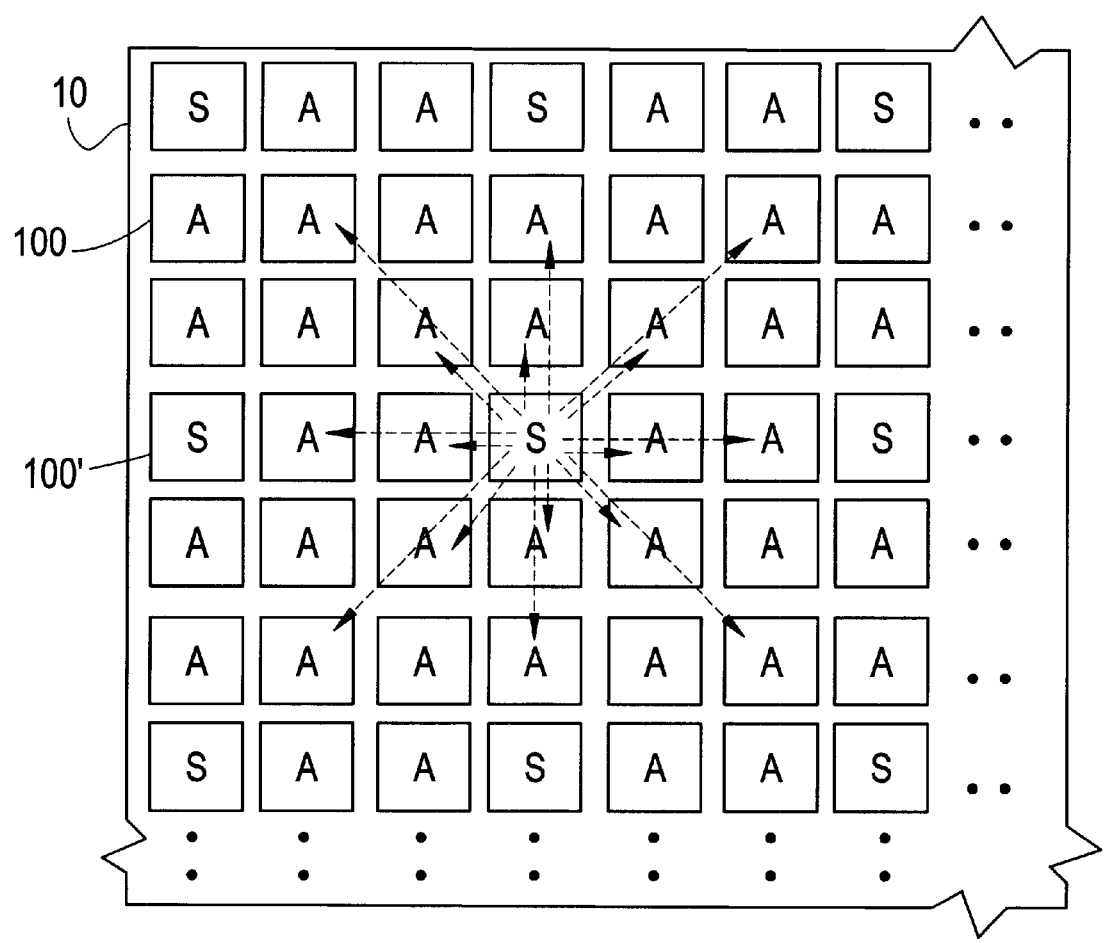
FIG. 1G is a functional depiction of an array of processing cells with only one spare cell for every eight array cells, yet with means for any of two spare cells to take over for any defective array cell.

Cells can be extremely small, with a practical lower limit set by the frequency of large lithographic errors. Because small cells have high raw cell yields, low-N redundancy schemes are optimal. Errors significantly larger than a single cell can wreak havoc with such redundancy schemes, so a reasonable lower limit for cell diameter is the average length of the longest fault in a region the size of the final array. While simply reversing the patterns of spare and array cells from a high-N schemes (such as that shown in FIG. 1E) produces extremely fault tolerant systems from few spare cells, some modifications can be beneficial in obtaining maximum fault tolerance and usefulness of array cells. In FIG. 1F, for example, some array cells (example cell marked with a') have four neighboring spare cells, while other array cells (example cell marked with a") have only two neighboring spare cells. This can be balanced by shifting some of each spare cell's replacement capability from neighboring cells to next-to-neighbor cells, as shown FIG. 1F, so that each array cell has three spare cells that can replace it. This provides 4-for-1 redundancy from having only one third as many spare cells as array cells in the network, whereas a classic 4-fold replication redundancy scheme would require times as many spare cells as array cells. For cells with extremely high raw cell yields, schemes such as that shown in FIG. 1G provide 3-for-1 redundancy from only ⅛ as many spare as array cells. A problem arises, however, when these sparse-spare schemes are applied to either memory or direct display cells, in that the pattern of array cells is not a regular rectangular array. A column (or row) oriented sparse-spare scheme such as that shown in FIG. 1H provides as much redundancy from a similar number of spare cells as does the scheme of FIG. 1F, but it leaves the array cells in a regular rectangular array suitable for both directly addressable memory cells and direct display cells, and is thus preferable even though the average distance between a spare cell and the array cells it can replace is slightly longer and grows slightly faster as the scheme is extended to even sparser arrays. For lithographies with high rates of small errors, embodiments can use intra-cell redundancies, such as adding spare bit and word lines to a cell's memory in a manner identical to a standard memory chip's spare lines, so that a cell can tolerate a few defective bits without even requiring a spare cell to be brought into play.

Embodiments can also include means for the array to be self testing. One simple technique is to have all cells run a test routine that exercises every instruction, with the array locating defective cells by having each cell comparing its results with all of its neighbors. Unless the same error occurs in the majority of cells in a region, the most common result in every region will be that from correctly functioning cells. Further embodiments can provide means for cells that test valid to vote to assassinate a defective neighbor by disconnecting its power supply. Disconnecting defective cells from their power supplies allows simple 'OR' gates to be used to combine paths from array and potential spare cells, as defective cell outputs will be forced to zero. Having separate means for a cell to be able to disconnect itself from power provides redundancy by preventing any single error from keeping a defective cell alive. Further embodiments provide means for the cells to automatically select a spare cell to replace any defective array cell. An algorithm can be as simple as just starting at one corner and working toward the opposite corner and, for every defective array cell, starting back at the original corner and searching for the first non-defective spare cell that can replace the defective array cell. A more sophisticated scheme could map out the defective cell density surrounding each cell, and replace defective array cells starting with the one with highest surrounding defect density and proceeding toward that with the lowest. For each defective array cell, the spare cells that could replace it would have their surrounding defect densities checked and the one with the lowest surrounding defect density would be chosen. Due to the high fault tolerance of the current invention, algorithms that investigate multiple patterns of cell replacement are not expected to be needed, although such schemes could be adapted from existing fault tolerant architectures or from circuit-routing software.

In traditional chip-based architectures the use of macroscopic interconnections between chips limits the number of connections that can be made between any given chip and the rest of the system, creating an off-chip data flow bottleneck. As processor clock speeds have increased faster than main memory chip speeds ("New Memory Architectures to Boost Performance", BYTE, July 1993), and as processor chips use increasing numbers of processing pipelines to increase their overall speed, the access to off-chip main memory has started becoming a limiting factor in performance ("Fast Computer Memories", IEEE Spectrum, October 1992). To reduce the need for communication across this bottleneck, new processors chips such as Intel's Pentium, Apple/IBM/Motorola's PowerPC 601, MIPS' 4400, and Digital's Alph a AXP (tm) processors all include large on-chip cache memories ("A Tale of Two Alphas", BYTE, December, 1993). This allows most memory accesses to be fulfilled through wide on-chip data paths (256 bits wide for the PowerPC and Pentium) instead of the narrower (32 or 64 bits wide) data paths to off-chip main (RAM) memory. But the amount of on-chip memory that can be added to traditional chip-based processors is small compared to the overall main memory used in such systems. Bulky, expensive multi-chip path-width-limited main memories are still necessary in these architectures. To free up more connections from the processor chip to the rest of the system in order to support a wider path to the main memory, a dual-ported main memory can be used to allow the processor and video subsystem to access the memory independently. This allows the processor to have control-only connections to the video subsystem, as the video subsystem can get its display data directly from the memory instead of from the processor, thus freeing up connections otherwise used to transfer video data from the processor chip. If these paths are then used to create a wider path to the main memory, the processor to memory access bottleneck can be temporarily relieved. Unfortunately for chip-based architectures, with both the processor and the video subsystem having separate paths to the memory, and with wider paths being used, such a solution requires greatly increasing the number of connections to EACH memory chip, which significantly increases the size and cost of the memory subsystem. If the individual memory chips could be made larger, fewer of them would be needed, and hence the total size and cost of the memory subsystem would be reduced or the number and width of paths to it increased. But high-capacity memory chips already push manufacturing capabilities; if a chip gets a 50% yield, a similar chip twice the size gets a 0.5×0.5 or 25% yield, and a chip four times the size gets a 0.5×0.5×0.5×0.5, or 6% yield.

Figure 2:
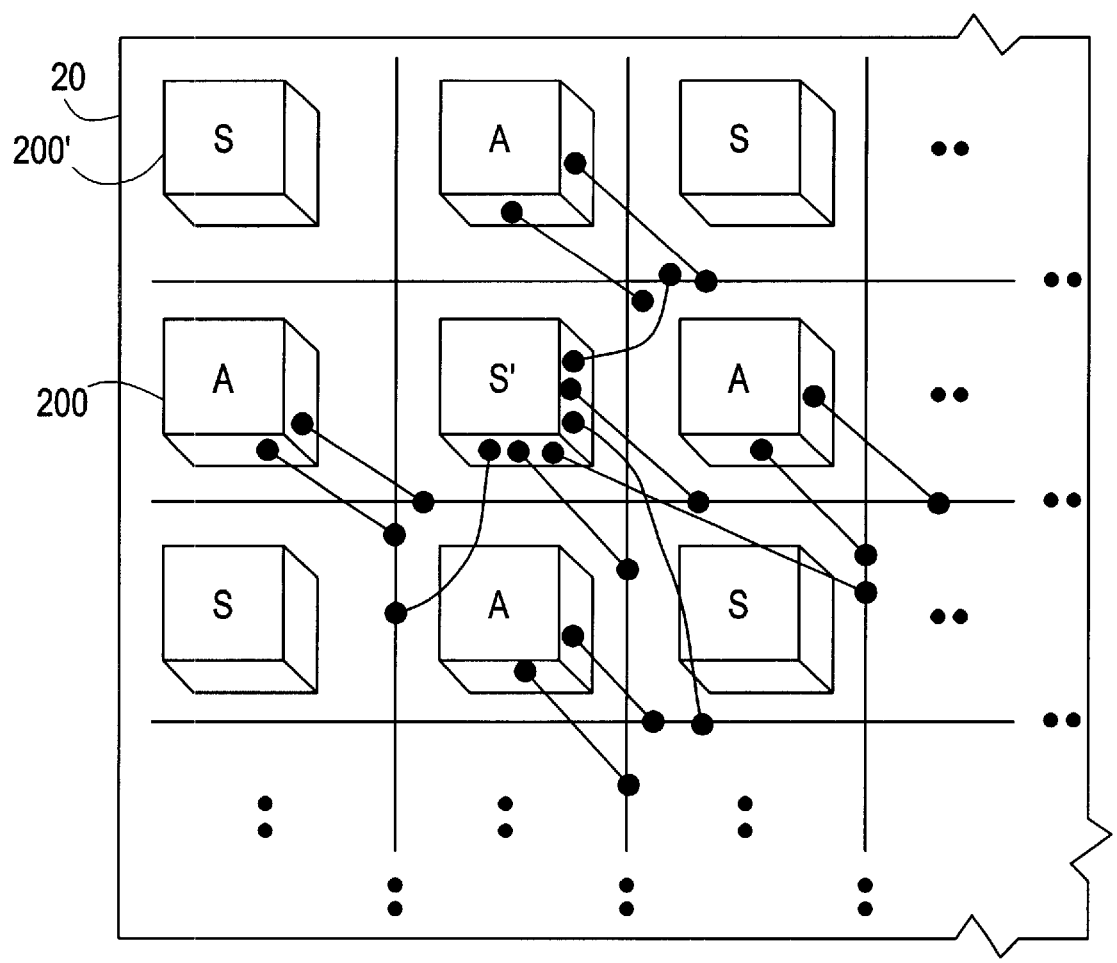
FIG. 2 is a functional depiction of a spare cell that is able to respond to the address of any one of its four nearest neighbor array cells should it be used to replace one of those array cells.

Accordingly, the fault tolerant monolithic data processing architecture in a preferred embodiment of the present invention overcomes the memory access bottleneck with a highly redundant monolithic network of memory cells that can be organized into a large fault-free array of cells, each of which can be directly addressed and can send and receive data via a global data bus. In the highly redundant network from which the array is formed, as shown in FIG. 2, the network 20 of cells contains directly addressable array cells 200 and spare cells 200' interconnected in such a manner that should any array cell prove defective, at least two spare cells are capable of taking over its functions (for clarity, connections from only one spare cell are shown in FIG. 2). In order for a given spare cell to take over for a given array cell in this embodiment, it must be able to be directly addressed as if it were that array cell, and yet not to respond to requests for any other array cell which it could have replaced. Further embodiments use techniques that minimize the power consumption and capacitance effects of unused connections, such as connecting a cell to multiple address lines and severing connections to unused lines through means such as those used to customize field-programmable gate arrays.

Although each cell could theoretically have only a single bit of memory, the power required in addressing a bit within a cell grows linearly with the number of rows plus columns of cells in the array, but only with the log (base 2 for binary systems) of the number of bits in each cell. Practical considerations thus dictate cells with at least 256 bits, and preferably more, for use in low-power, high performance memory systems, with an upper size limit set by lithographic error rates. In practice memory-only cells according to the present architecture are expected to internally resemble the cells on current memory chips, which typically have 64 k bits per cell. Using direct addressing of cells in such an array allows each cell's memory to be used as part of a global memory without the performance loss of indirect addressing or sending data through other cells. Thus the array as a whole can be used as a compact high-performance monolithic memory system. Using the same lithography used for today's 16 megabit chips, th is embodiment can pack a gigabit, or over 100 megabytes, onto a single monolithic region that can be fabricated on a 6" wafer.

Not only is such an array more compact and less expensive than using the up to 60 or so individual memory chips it replaces, but having a monolithic memory module allows as wide and as many data paths to be connected to it as the rest of system will support. This can allow both a processor and a video subsystem to have inde pendent wide paths to the same memory, for example. Memory cells and arrays using the architecture disclosed in the present invention can also use recent advances in chip-based memory architectures, such as fast on-chip SRAM caches, synchronous DRAMS, and RAMBUS's fast data transfer RDRAMs, and even exotic advances such as the IEEE's RamLink architecture ("Fast Interfaces for DRAMs", "A New Era of Fast Dynamic RAMs", "A Fast Path to One Memory" and "A RAM Link for High speed", IEEE Spectrum, October, 1992).

The off-chip bottleneck of chip oriented architectures is likely to continue to worsen. Microscopic and macroscopic manufacturing improve at roughly the same rate, but doubling the capability of both allows four times as many circuits to be placed within a given chip's area, while only doubling the number of connections that can be made around its circumference. The 0.6 micron lithography of the Mips R4400 processor chip, for example, creates such compact circuitry that the chip actually has an empty region around the processor core to make the overall chip big enough to support all its macroscopic connections to the rest of the system ("Mips Processors to push Performance and Price", Electronic Products, December, 1992). The largest single consumer of these off-chip data paths with today's processors is access to off-chip memory.

Figure 3:
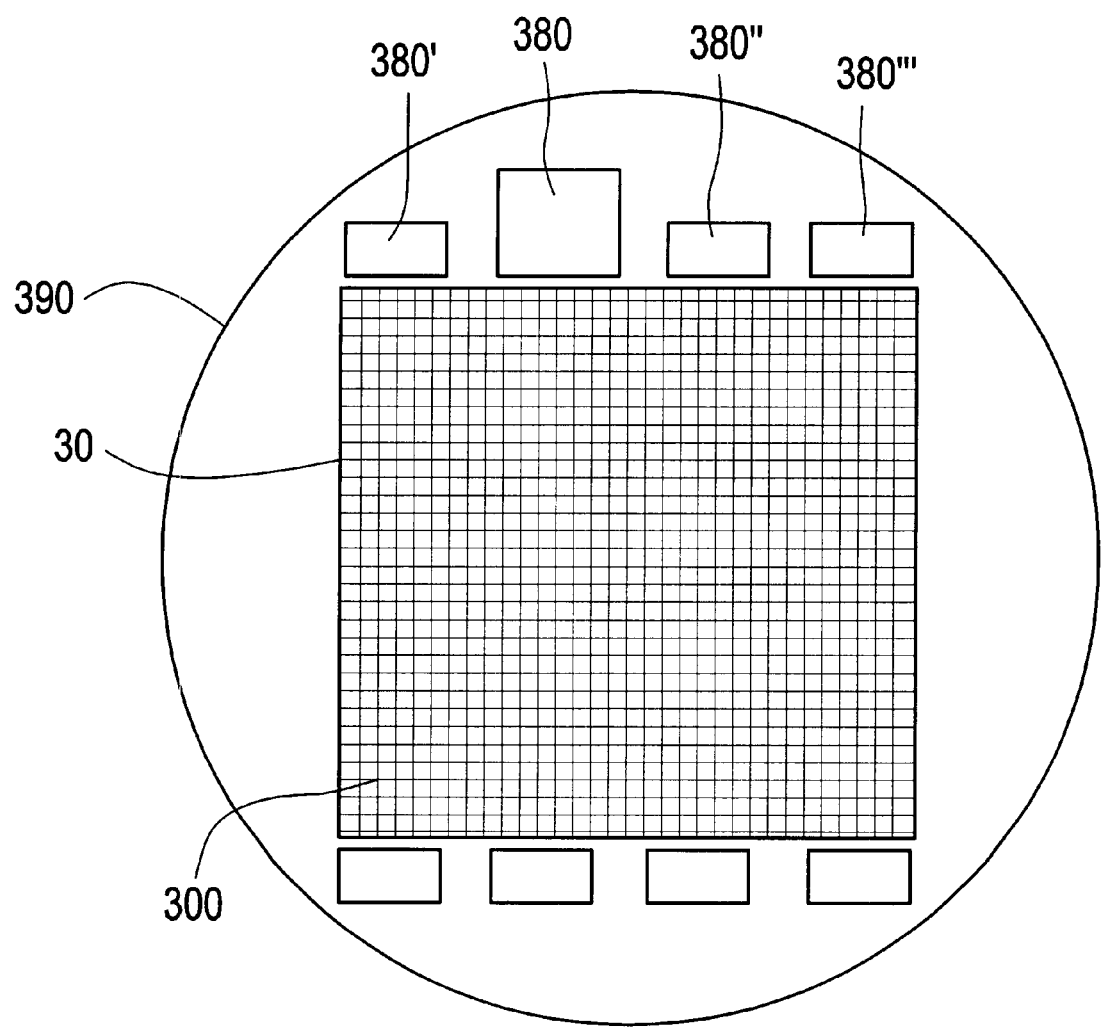
FIG. 3 is a geometric depiction of a wafer with a memory array and a "mono-chip" CPU and other interface "chips"

Accordingly, the fault tolerant monolithic data processing architecture in another embodiment of the present invention as shown in FIG. 3 combines one or more standard "monochip" RISC or CISC processors 380 fabricated on the same monolithic substrate 390 with the monolithic memory array 30 of memory cells 300 as described in the previous direct access memory embodiment of the present invention. While this will reduce the overall yield to the array's yield times that of the processor(s), it keeps all the processor/memory interconnections on a microscopic scale on a single monolithic region. This leaves the entire circumference of the whole region, which is considerably larger than that of a single chip, free for connections to other subsystems. Using this embodiment one can reduce the entire memory and processor subsystems of an advanced desk-top system (such as a 486 with 16 megabytes of main memory) to a single credit-card sized module. It is anticipated that arrays with defective processors can have those processors disabled and still be used as memory-only arrays, and that other functions, such as bios chips 380', video accelerators 380", or I/O controllers 380''' could be integrated in addition to or instead of the processors(s).

The use of single processors is itself increasingly a bottleneck. Most small and mid-sized computers today are based on the single-processor architecture formalized 50 years ago by mathematician John von Neumann. While dramatic performance improvements have come about through the fabrication of ever smaller components and ever more complex chips, the demand for compute power has increased faster still. A variety of techniques such as RISC processors, instruction pipe lining, cache memory and math coprocessors have been implemented in an effort to squeeze maximum performance out of the von Neumann architecture. But these techniques do not AVOID the von Neumann single-processor bottleneck—they merely delay the point at which it becomes critical. As small computers take over tasks once beyond their mainframe cousins, such as engineering simulations, natural language processing, image recognition, and full-motion video, performance improvements have fallen behind. But developing faster processors is not the only way to increase processing power for such tasks. Instead of using one processor, parallel processing architectures use many processors working simultaneously on the same task. Multi-processor systems with several processors sharing a common memory have dominated the mainframe and supercomputer world for many years, and have recently been introduced in desk-top computers. While these parallel computer systems do remove the von Neumann single-processor bottleneck, the funneling of memory access of many processors through a single data path rapidly reduces the effectiveness of adding more processors, especially when the width of that path is limited by the off-chip data flow bottleneck. Most massively parallel architectures solve this multi-processor memory contention by having local memory associated with each processor. Having more than one processor chip, however, adds inter-processor communications to the already crowded off-chip data flow, intensifying pressure on the off-chip bottleneck.

Accordingly, the fault tolerant monolithic data processing architecture in another embodiment of the present invention overcomes this bottleneck with a highly redundant network of cells containing both memory and processors that can be organized into a regular fault-free array of cells, thus integrating a complete highly parallel or even massively parallel processing array and its local memories into a single monolithic entity. Preferred embodiments include means for the cells to communicate through a global data bus, and means for the cells to be directly addressed. This allows the combined memories of the cells to act as a shared main memory for the processor array as a whole when processing a serial task, and still allows the array to be a local-memory parallel processing array when processing parallel tasks. A global bus is also exceptionally useful for communicating instructions to the processors when operating in SIMD (Single Instruction, Multiple Data) mode, or for data when in MISD (Multiple Instruction, Single Data) mode. Such embodiments are ideally suited for use as a parallel processing graphics accelerator. Further embodiments include means for using an array cell's registers and/or local cache memory as a cache for another processor access to that cell's memory, as SRAM cache is now used on fast DRAM chips to boost their performance.

While an array of cellular processing elements which communicate solely through a global data bus is efficient at solving action-at-a-distance parallel computing problems such as galactic evolution, where every star exerts a gravitational pull on every other, most parallel processing tasks involve higher degrees of connectivity. Because of this most parallel data processing systems use a higher degree of connectivity between their processors. For small numbers of processors, a "star" configuration, where every processor has direct connections to every other processor, is most efficient. But as the number of processors grows, the number of connections to each processor grows, too. With today's technology a chip-based processor can devote no more than a couple of hundred connections to this, so with 32-bit wide data paths the off-chip bottleneck limits this scheme to at most a dozen processors. Even the monolithic architecture disclosed in the present invention can support less than a hundred processors in such a configuration when redundant paths are factored in. Because many massively parallel tasks can exploit thousands of processors, most massively parallel architectures adopt a connectivity scheme intermediate between a single global bus and every-processor-to-every-processor connections. The most prevalent of these is the "hypercube" connectivity used by Thinking Machines Corp. in its "Connection Machine" computer. But most massively parallel tasks, such as fluid dynamics, involve at most three dimensional neighbor-to-neighbor interactions rather than random processor to processor connections, allowing simpler interconnection schemes to be efficiently employed.

Figure 4A:
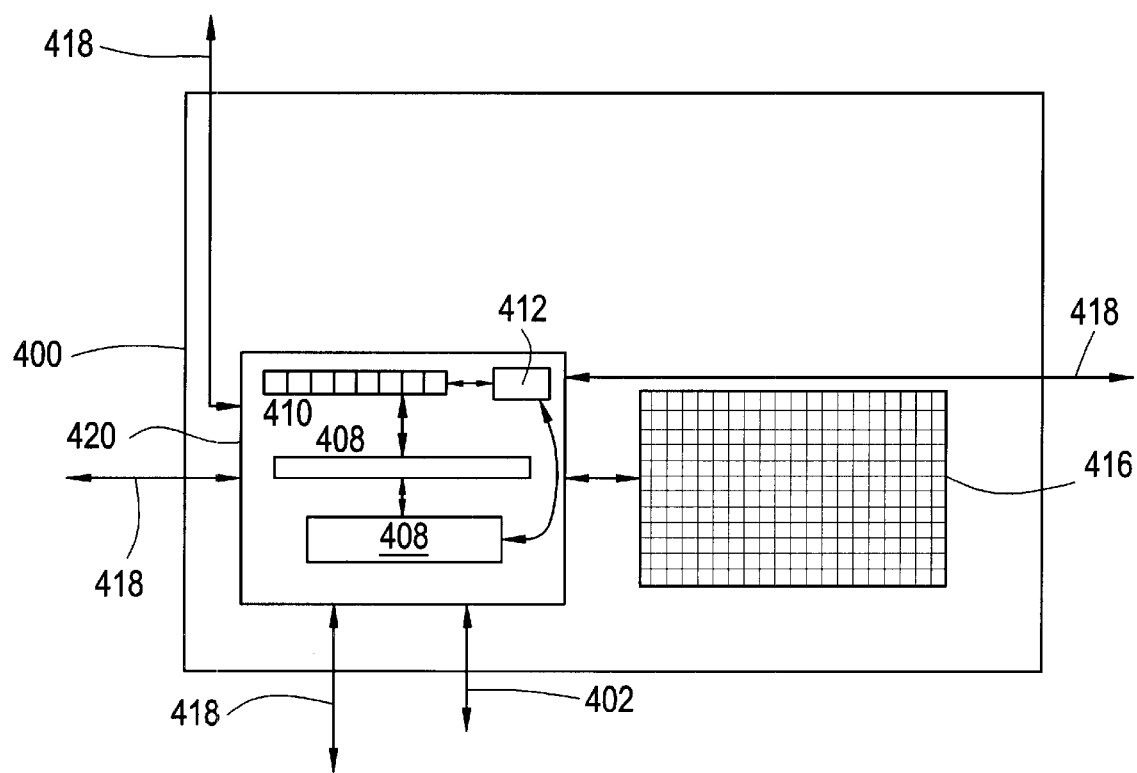
FIG. 4A is a functional depiction of an array cell with both processing and memory means in accordance with the invention.

Another embodiment of the data processing architecture according to the present invention as shown in FIG. 4A therefore provides an array of cells 400 where each cell has means 418 for communication with neighboring cells in addition to means 402 for input and output to a global data bus. This combination is simpler than, and as efficient for most parallel processing problems as, the hypercube connectivity used in the Connection Machines. Means 418 for communication between neighboring cells can be through direct connections or through memory means placed between the cells and shared by the cells in a manner similar to the shared memories of U.S. Pat. Nos. 4,720,780 and 4,855,903.

One of the simplest systems that can use neighbor-to-neighbor connectivity is a neural network—each cell 400 needs only sufficient processing and memory to contain a connectivity value for each of its neighbors and to be able to add up these values when it receives signals from its neighbors, and, when the accumulation reaches a certain value, send signals to its neighbors, for such an array to perform useful work. While bi-directional communication 418 with two neighboring cells, one bit for a connectivity value for each of those cells, and a two bit register for adding connectivity values is theoretically sufficient to create a neural network in a sufficiently large array of cells, practical considerations dictate means 418 for bi-directional communication with at least three neighboring cells, memory for a connectivity value of at least 2 bits for each of those cells, and an accumulation register of at least 4 bits. Further additions of memory 416, processing power 420, and higher-dimensional interconnections make neural networks easier to implement and raise their performance, and enable the interconnected array to handle a wide range of other parallel processing tasks as well. Fluid dynamics simulations, for example, usually can be implemented with less than 64 bytes of memory 416 per cell 400, although more memory makes the job significantly easier. In rectilinear arrays of cells bi-directional connectivity 418 to four physical neighbors is expected to be optimal in almost all cases, with bi-directional connectivity with neighbors in additional logical dimensions advantageous for many systems.

Figure 4B:
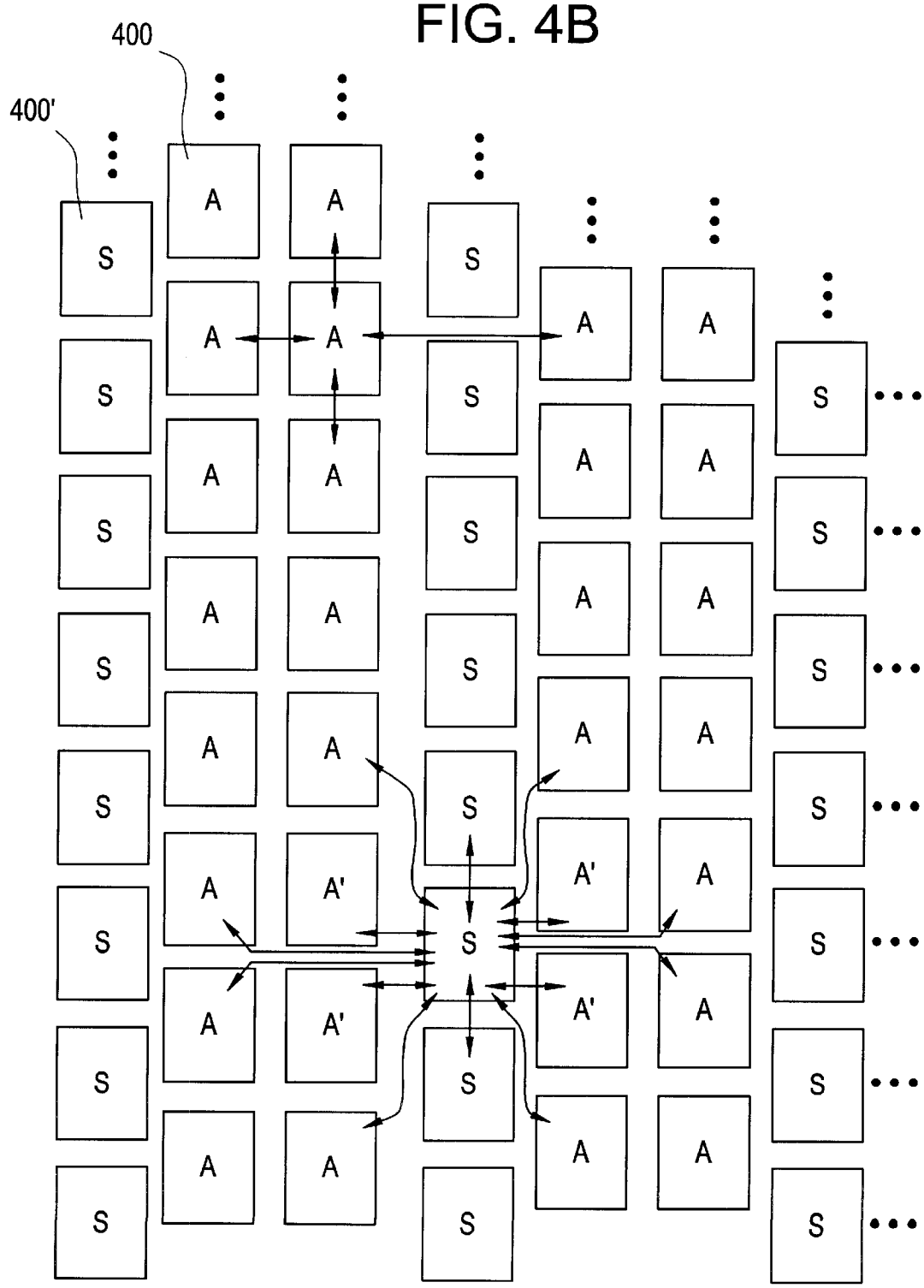
FIG. 4B is a functional depiction of an array of such cells showing paths from a spare cell that can replace either of two neighboring array cells.
Figure 4C:
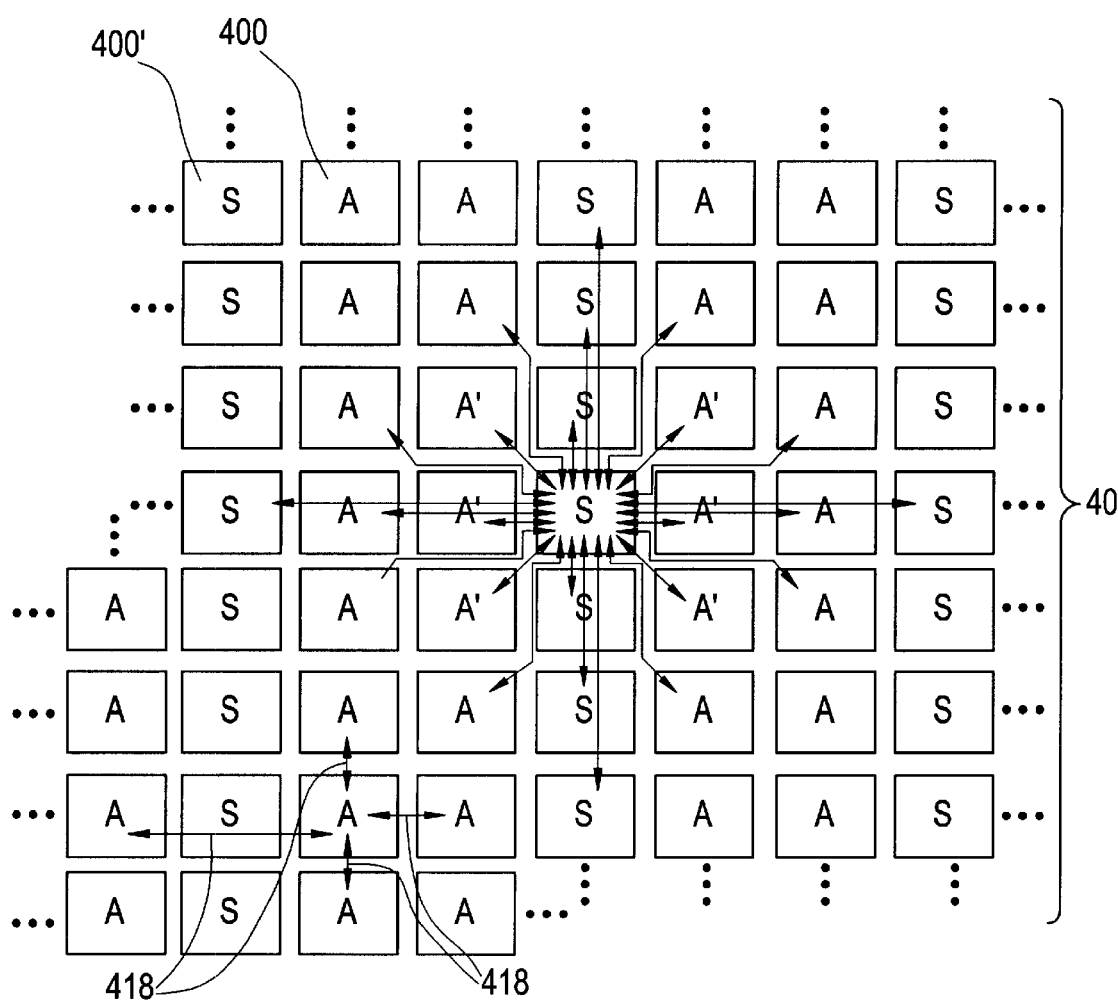
FIG. 4C is a functional depiction of an array of such cells showing paths from a spare cell that can replace any of three neighboring array cells.
Figure 4D:
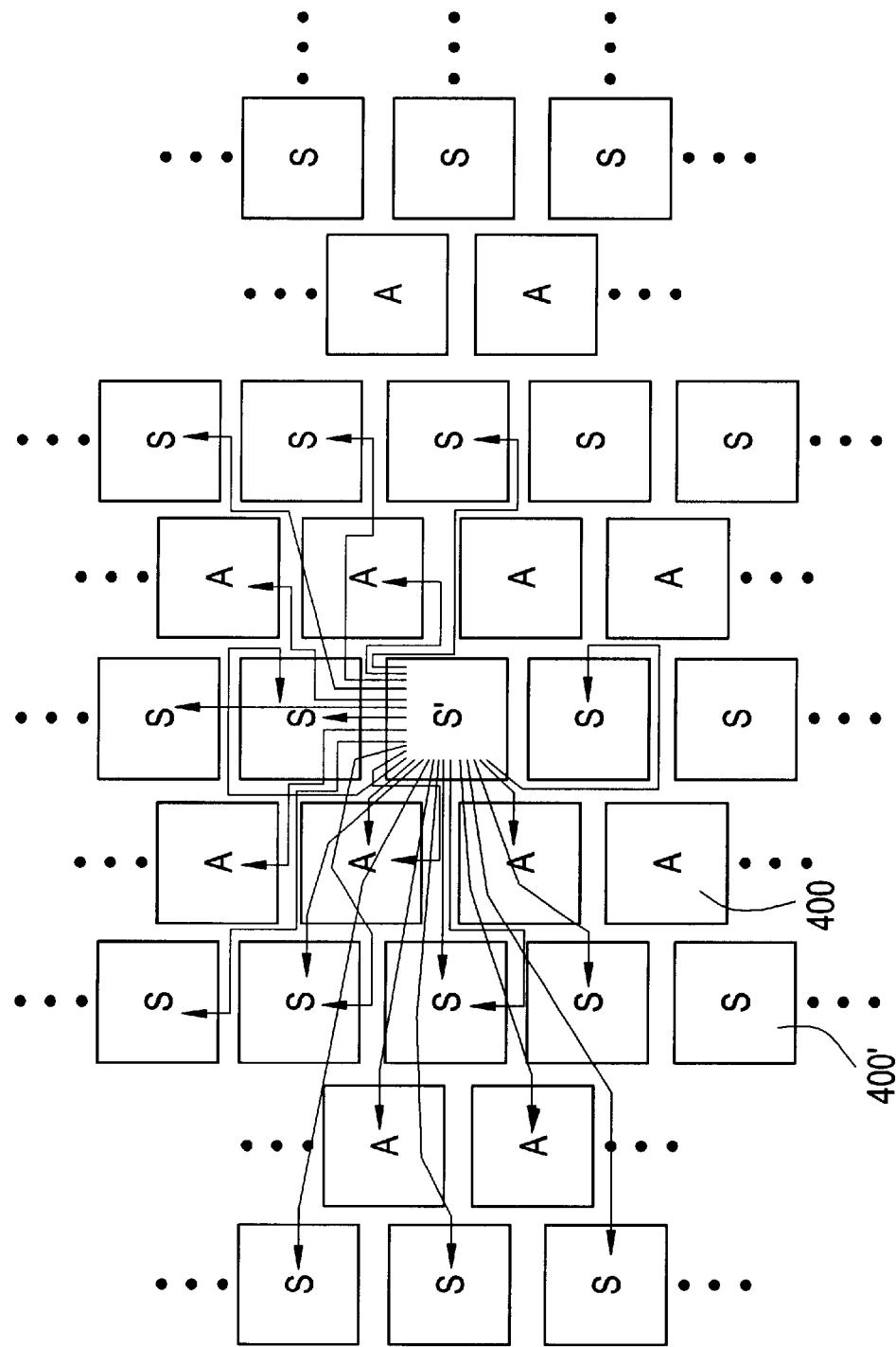
FIG. 4D is a functional depiction of an array of such cells showing paths from a spare cell that can replace any of four neighboring array cells.

When inter-cell connections are added to a given array cell, corresponding connections must be added to all spare cells capable of directly replacing that array cell. When each spare cell can directly replace a number of array cells, the interconnection pattern grows quite complex. FIG. 4B shows the intercell connections needed for one array cell and one spare cell in a network of array cells 400 and spare cells 400' where each array cell has connections to its four physical neighbor array cells, when using the 3-for-1 spare cell scheme of FIG. 1A. FIG. 4C shows the corresponding interconnections when the 4-for-1 spare cell scheme from FIG. 1B is used, and FIG. 4D shows the corresponding interconnections when the 5-for-1 spare cell scheme from FIG. 1C is used, which would be suitable for RISC processing cells up to a few millimeters on a side with today's lithography (only the connections from the top and left sides of one spare cell are shown for clarity in FIG. 4D; connections from the bottom and right can be deduced by symmetry). FIG. 4D also includes a plurality of connections to some of the cells because the spare cell shown can replace one of a plurality of neighbors of each of those cells; the patterns in FIGS. 4B and 4C require that distinguishing which neighbor of a given array cell a spare cell has replaced be handled internally by that array cell. These patterns can be extended to higher-dimensional or even hypercube arrays, as long as each connection for each array cell has a corresponding connection in each spare cell that can replace that array cell. Because the monolithic nature of the array allows over an order of magnitude more connections to each processor than in a chip-based array, further embodiments can also provide row and/or column oriented addressing and data busses in addition to neighbor-to-neighbor and global data bus connectivity. It is even possible to provide complete hypercube connectivity as well for those cases where it would improve efficiency enough to be worth the added complexity.

Figure 4E:
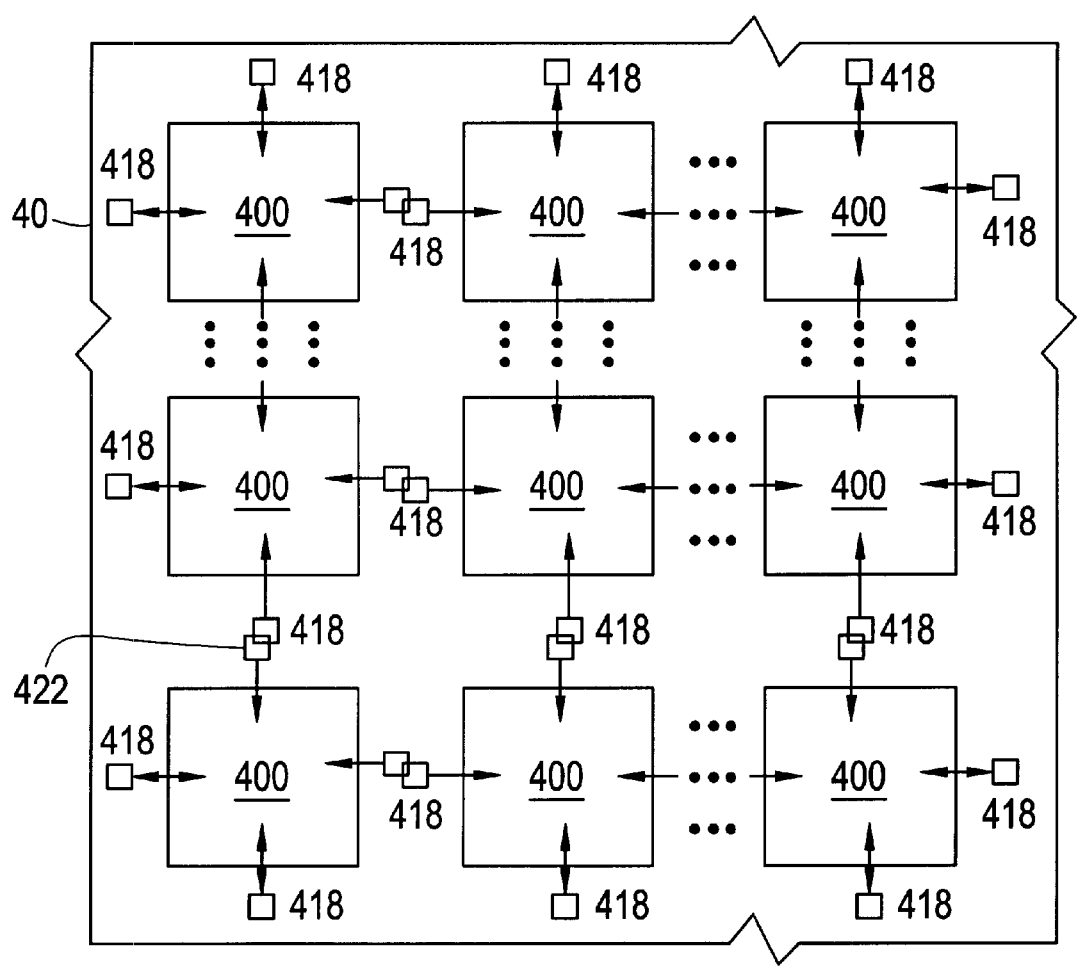
FIG. 4E is a functional depiction of an array of such cells showing alignment-insensitive contact means.

For fabrication with current lithographic techniques, arrays 40 that are larger than the area of the fabrication masks use alignment-insensitive contacts 422 as shown in FIG. 4E to connect neighboring cells across mask boundaries (only one contact per path is shown for simplicity, although paths may be many bits wide). Alignment-insensitive contacts thus allow the use of rows or arrays of small individually aligned masks to be used to produce large arrays as single units. Alignment-insensitive contacts are also necessary when pushing the limits of lithography, as a leading edge lithography can typically maintain its alignment over distances of only tens of millimeters.

Another embodiment for systems expected to run predominantly serial software would include one or more fast serial processors fabricated on the same monolithic substrate as the cell network (with the serial processors being disabled when detective). The cell array could act as fast memory for the serial processor for serial tasks, and as a parallel accelerator for processing parallel tasks, such as sorting, searching, and graphics acceleration. Another embodiment would include means for a spare cell replacing a defective cell to copy that defective cell's memory, enabling dynamic recovery from some post-manufacturing defects.

The commercial viability and speed of acceptance of a new data processing architecture are greatly enhanced if systems based on the new architecture are compatible with existing software. With the architecture disclosed in the present invention, compatibility can be achieved without each cell being able to handle the hundreds of instructions of a CISC microprocessor architecture or even the dozens of instructions of a RISC microprocessor architecture. If a given cell has sufficient memory and processing power to handle one instruction from the target instruction set, then a set of dozens or hundreds of cells can cooperate to emulate the entire instruction set. Because all processors involved are connected at a microscopic level, wide enough paths can be used to provide reasonable performance through such emulation. A further embodiment of the massively parallel data processing architecture of the present invention therefore includes sufficient processing power for each cell to handle any one instruction from a RISC or CISC microprocessor architecture, allowing sections of the array to be programmed to run existing software in addition to software in the array's native instruction set. Further memory is, of course, highly advantageous, with between 1024 and 4096 bytes per cell providing a good balance between cell size and cell memory for arrays designed to emulate other processors through single-instruction-per-cell emulation.

In such embodiments it is also advantageous to have a regional data bus connecting the set of cells that are used to emulate the more complex processor. A regional data bus gives each emulated processor access to the combined memories of its component cells without the overhead of multiple neighbor-to-neighbor passes and without creating a bottleneck on the global data bus. In still further preferred embodiments the size of the regional data bus is not predefined—cells have the ability to join or leave a regional data bus, allowing its size to change as processing tasks change. Emulating instructions, however, is slower than supporting them directly, so further embodiments have a cell size large enough to include a processor and memory that can directly support (as native instructions) all the commonly used instructions, and support with out involving other cells all of the instructions, from at least one standard RISC or CISC processor instruction set. This allows an array cell to act as an efficient serial processor for that instruction set, and the array as a whole to act as an efficient parallel processor for that instruction set. With today's DRAM technology 64K bytes per cell provides a good balance between memory and processor size for processors that can handle today's RISC instruction sets, decreasing raw cell yield by less than a percentage point and providing each cell sufficient local memory to handle a fairly complex subroutine (a cell needs enough memory for instructions AND data in MIMD mode, but just data in SIMD mode).

Existing parallel systems have no facilities for using multiple processors to speed up the processing of serial programs at less than an independent thread level. But with the architecture disclosed in the present invention, even massively parallel systems will be only slightly more expensive than mono-processor systems of the same processor speed (instead of orders of magnitude more expensive), so they may often be used for serial tasks. Adding multiple-pipelines-per-processor, branch predictors, instruction prefetchers and decoders, etc., the approach used by high-end processor chips today, would greatly increase the cell size and decrease cell yield, reducing the number of cells available for parallel tasks and requiring an even more fault-tolerant cell network. But each cell contains a superset of the features needed to act as a pipeline, etc. for its own instruction set. Further embodiments therefore include the ability for one cell to use its neighboring cells as independent pipelines or other accelerators to boost its serial instruction throughput.

Because in most suitable spare cell interconnection schemes only a small fraction of the spare cells are defective themselves or are used to replace defective array cells, most of the perfectly good spare cells are left over after forming the fault-free array of cells. These spare cells have numerous direct connections to other leftover spare cells, as well as connections to the array and the array's busses. This makes these left-over spare cells ideal for running serial tasks, as they have lots of direct connections to cells that can be used as accelerators such independent pipelines, branch predictors, speculative executors, instruction prefetchers and decoders, etc. This should allow clusters of small cells to match the throughput of complex mono-chip processors operating at the same clock speed. This also leaves the entire regular array free to serve as a high-performance memory system or a parallel graphics accelerator for the "serial processing" cell cluster, so overall system throughput may actually be higher than conventional systems even on serial processing tasks. Further embodiments therefore include means for a clusters of cells to cooperate when processing a serial task by using a plurality of cells as accelerators for that task.

The use of "left-over" spare cells can be extended in other ways. Although these cells do not form a regular array, they are linked together in a network. This allows one cell to communicate with another's data via any intermediate cells. While this does not have the performance of direct addressability, it is none the less sufficient to allow one left-over cell to map the combined memories of other left-over cells into a contiguous medium-performance address space. This allows what might otherwise be wasted memory to be put to use as a RAM-disk, disk cache, I/O buffer and/or swap space for virtual memory. At today's lithography, this would amount to around 12 megabytes on a credit-card sized system, and around 50 megabytes on a 6" full-wafer system. Instead of passing signals through intermediate cells, regional-data-bus embodiments where power and heat are not critical issues could use intermediate performance bus-based addressing for the spare cells in the RAM disk, etc.

Computer displays can be built o n wafer s today, but these displays lack defect tolerance, so every pixel and its support circuitry must be functional or there will be an obvious "hole" in the array. While million-pixel arrays can be made defect free (although with persistently low yields), a wafer can hold many times that many pixels. The necessity for perfection would, however, reduce yields of such arrays to near zero. Because the human eye can handle orders of magnitude more pixels than today's displays use, advancements in lithography alone would be unlikely to solve this problem for many years. Previous fault tolerant architectures arc not well suited for output arrays; the N-fold replication schemes devote too small a fraction of the array's surface to active elements, and the more sophisticated cell-based schemes have multiple shifts, bounded only by the edge of the array, in array cell positions (and hence pixel positions) for each defect handled.

The fault tolerant monolithic data processing architecture according to another embodiment of the present invention therefore overcomes the display resolution limit with an N-for-1 redundant monolithic network of cells that can be organized into a large regular fault-free array of cells, each of which has at least one optical sub-pixel (a color display might have several sub-pixels per pixel), and where each array cell has a plurality of physical neighbors that can directly replace its functions without propagating the displacement to other cells, and without the overhead of N-fold replication of the array cells. Embodiments of the fault tolerant architecture of the present invention as shown in FIGS. 1A, 1B, 1C, 1D and 1E produce regular arrays of cells that can handle high levels of defects with each defect merely shifting the functions of one cell to a spare neighboring cell. If the cells are small enough so that such a shift is not normally noticed by a human eye (approximately 50 microns at a normal reading distance), the defect is bypassed and the array can still be considered free from uncorrectable faults in spite of one or more defective pixels or sub-pixels. Several technologies for fabricating pixels below the visible-optical-defect size of 50 microns are already known in the art. Sony's Visortron (". . . and VisorTrons from Japan", Popular Science, March, 1993) uses 30-micron LCD sub-pixels, and Texas Instrument's Digital Micromirror Device (Mirrors on a chip, IEEE Spectrum, November 1993) uses 17-micron pixels. Other potentially suitable types of optical output means include, but are by no means limited to, light emitting diodes, semi-conductor lasers and ultra-miniature cathode ray tubes, microscopic mirrors and field effect displays elements.

Traditional computer systems use many regions of integrated circuits fabricated on separate substrates for memory, processing and output. This allows defective regions to be replaced before the regions are connected to each other. The resulting macroscopic scale interconnections increase size, cost, and power use for such systems, and create interconnectivity bottlenecks. Yet without the ability to replace defective regions, the overall yield in traditional architectures would be prohibitively low as it depends on the product of the yields of all the components.

The fault tolerant monolithic data processing architecture according to another embodiment of th e present invention therefore integrates all integrated circuits for a system's memory, processing and display onto a single monolithic substrate. Because the architecture of the present invention allows all of these to be implemented monolithically with extremely high yields, overall yields of such integrated systems should beat least moderate high. Various sorts of input (such as voice) can be implemented without additional integrated circuits, so this embodiment can result in placing all integrated circuits for an entire system onto a single monolithic substrate. Many types of input, such as acceleration, position and orientation detectors, sonic detectors, infra-red and radio signal detectors, temperature detectors, magnetic field detectors, chemical concentration detectors, etc., can also be implemented on the same substrate as the rest of the system, as can means for power absorption and/or storage, so further embodiments cancn integrate an entire system, from input through processing and memory to output, onto a single monolithic substrate. This eliminates the need for any complex macroscopic interconnections between system parts. These single substrate systems greatly reduce system size, cost and power requirements.

The fault tolerant arrays provided in other embodiments of the current invention should be advantageous in most data processing systems. Some useful single substrate systems, however, can be built without such an array; systems that require less or no fault tolerance, for example, or systems with fault tolerance at an organizational level, such as dedicated systems for neural networks.

Accordingly, the fault tolerant architecture in another embodiment of the present invention integrates an entire data processing system of any suitable type onto a single substrate. In a further embodiment, all functions of such a data processing system are interconnected on a microscopic scale.

Many computer displays, however, use amorphous or polycrystalline silicon instead of crystalline silicon, as these substrates are less expensive and can be fabricated in larger-than-wafer sized regions. These substrates are not suitable for high-performance memory or processors with today's architectures, so displays that are fabricated on regions of substrate separate from the rest of the system may still be advantageous in some cases. Today's high-end displays use several megabytes of data per image, and photograph-quality displays will require orders of magnitude more. As the display resolution and scan rate increase, more and more of a burden is placed on the central processing unit and its output data path (Fast DRAMs for Sharper TV, IEEE Spectrum, October 1992), and on the input data path for the display. Because the fault tolerance provided for displays by the architecture of the present invention allows vast increases in numbers of pixels in a display, it will further accelerate this trend. Traditional display architectures use output elements that contain no processing power of their own, but merely transmit preprocessed data. These output elements cannot add or subtract or edit-and-pass-on a data stream, so they can do no data decompression; the output array thus requires an uncompressed data stream. Adding processing power to display elements to support compressed data formats would increase their complexity, and thus decrease their yield. In a traditional fault-intolerant display architecture, this would decrease yields dramatically—even with only one transistor per color per pixel, active matrix LCD displays are pushing the limits of manufacturing technology and suffer from correspondingly low yields.

Figure 5A:
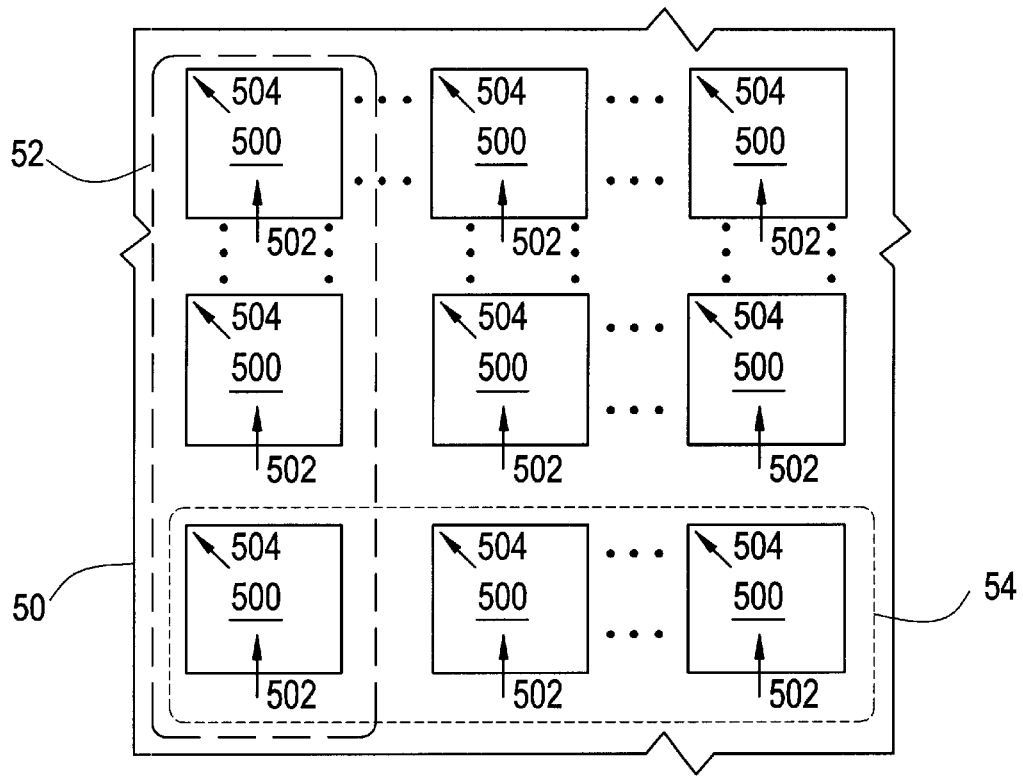
FIG. 5A is a functional depiction of an array of direct output data-decompression cells in accordance with the invention.
Figure 5B:
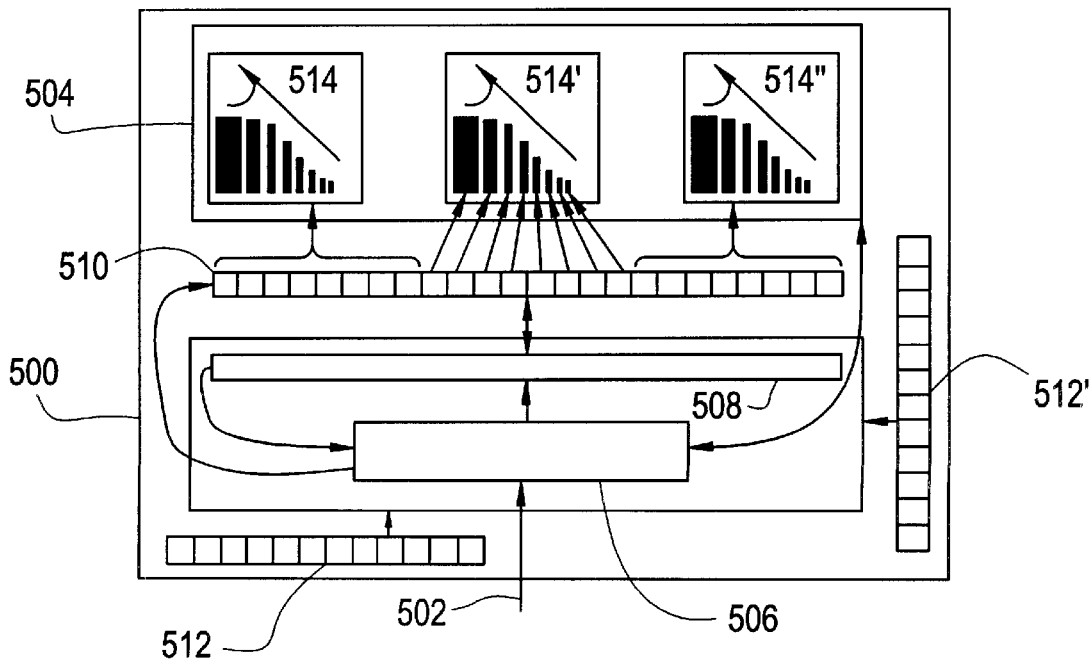
FIG. 5B is a functional depiction of one of the cells of FIG. 5A.

Accordingly, the Fault tolerant architecture in an embodiment of the present invention as shown in FIGS. 5A and 5B overcomes the processor output and display input bottlenecks with a highly redundant network of cells that can be organized into a regular fault-free array of cells, where the array cells contain both one or more direct output elements and sufficient memory and processing power to extract the output data for those direct output elements from a compressed data stream (for clarity spare cells are not shown in FIG. 5A).

While the fault tolerant schemes disclosed in this architecture can support complex processors without lowering overall array yields significantly, a direct-output array is useful even with very little processing power per cell. In a minimalistic embodiment, which can be built with a cell size smaller than the visible-optical-defect size of 50microns on a side, each array cell 500 would contain a global input 502, optical direct output means 504, a count register 510, th e negative of its cell address 512 and 512', and the processing power to add a number from the input 502 to the count register 510 and check the result for a register overflow. Types of optical direct output means 504 include, but are not limited to, light emitting diodes (LEDs), liquid crystal display elements (LCDs), semi-conductor lasers and ultra-miniature cathode ray tubes (CRTs), Field Emitter Displays (FED's), and porous silicon ("Optical chips: Computer Innovation with a Bright Future", The Valley News, Nov. 30, 1992). Many sophisticated data compression schemes are already known in the art, but this architecture applies well to simple schemes, too. An example of a minimacistic data compression scheme and sufficient processing power to decompress it is to provide each cell with a four-instruction decoder 506. Two-bit opcodes are used to represent the four different instructions—"This cell's output becomes . . . (COB)", "Next N cells' output become . . . (NCOB)", "Next N cells' output remain unchanged (NCRU)", and "Reset (RES)". When the decoder 506 receives the RES (reset) opcode, it copies its negative cell address 512 and 512' to the count register 510. Then, as each opcode is encountered the adder 508 adds the number of cells the instruction controls (N for NCOB and NCRU or 1 for COB) to the count register 510. When the count register overflows, the cell uses the opcode that caused the overflow to determine the new output value for the direct output means 504. For NCRU, the cell's direct output remains unchanged. For COB or NCOB, the cell adopts the data portion of the instruction for its new output data. The compression principle is similar to what current FAX machines use for data transmission except that the compression opcodes cover changing displays as well as static displays. The datum that the cell can display can range, depending on the implementation, from one-bit black and white to multibit grayscales to full color output. In a typical implementation the datum might be a 24-bit word where 8 bits each refer to the relative intensities of red, green and blue direct outputs 514, 514' and 514".

A minimum-processing-power implementation could provide each cell with 8 direct outputs for each color with relative intensities of 1, 2, 4, 8, 16, 32, 64 , and 128, corresponding to the intensity bits for that color (this uses the intensity bits directly as flags instead of processing them as a number) or use an analog variable-brightness element per color per pixel, as modern color SVGA display do. With the best lithography now used in production (November 1993), a density of over 200,000 per square inch is possible, giving such an array resolution several times better than and color reproduction far better than a glossy magazine photo, and allowing a display with 8 times more pixels than a top-of-the-line SVGA display to be produced on an 8-inch silicon wafer. With slightly more processing power per cell, an 8 bit intensity multiplier can be added to each datum to form a 32 bit word. A minimalistic way to do this is for the cell's processing to be the same except that a pixel's complete set of direct outputs is switched on and off at a constant rate of at least 60 times per second, with the length of the "on" phase being proportional to the 8 bit intensity multiplier. This gives the display a far greater range of intensity and simplifies the adjustment of output brightness to compensate for changes in ambient light intensity. Cells with more functionality can support more sophisticated data encoding schemes, such as a Hamming or other error correcting code.

Figure 6A:
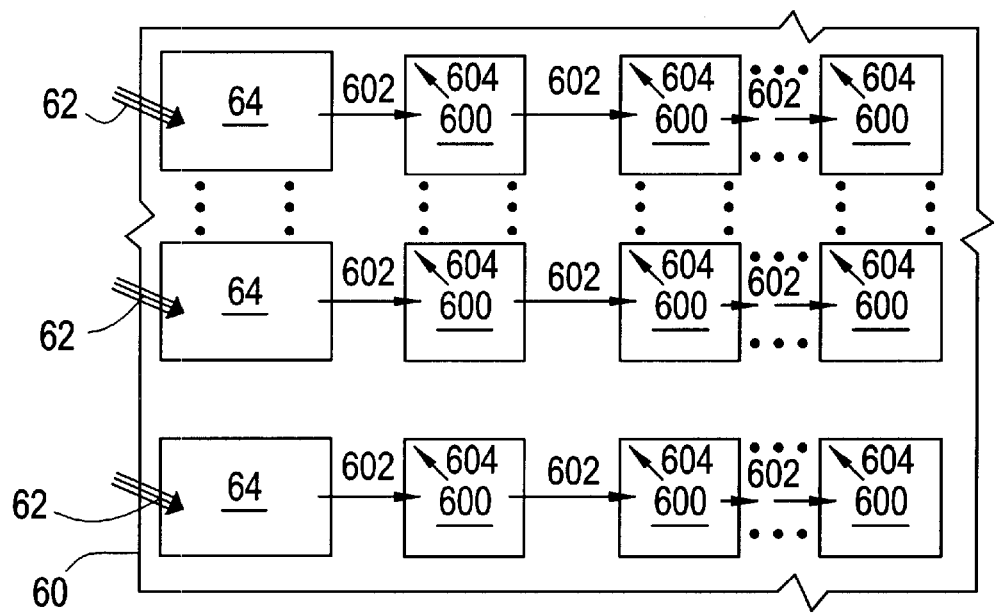
FIG. 6A is a functional depiction of an array of direct output data-decompression cells where the cells use neighbor-to-neighbor communication instead of cell addresses and a global input.
Figure 6B:
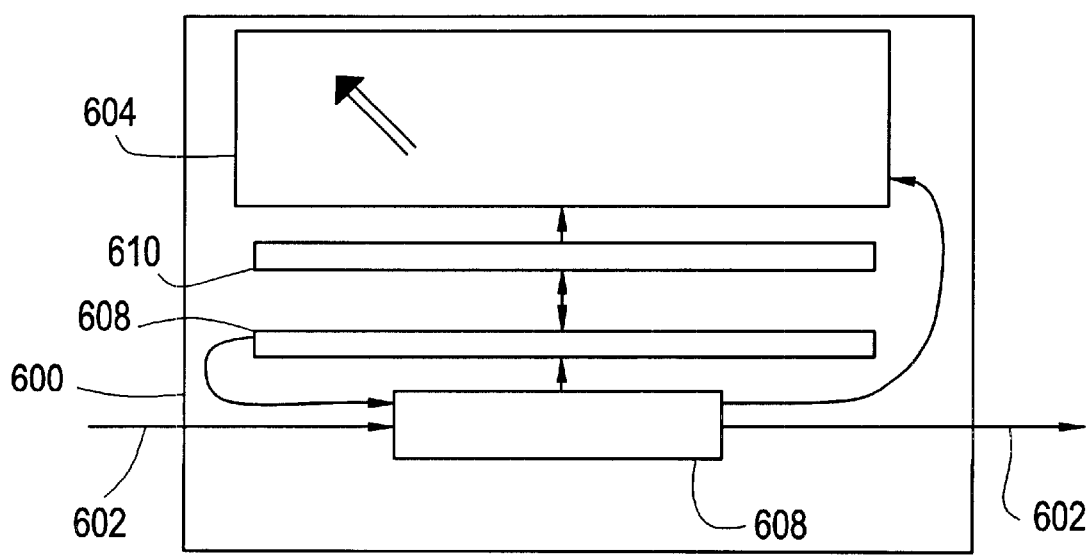
FIG. 6B is a functional depiction of one of the cells of FIG. 6A.

Even with data compression some output-intensive tasks will encounter a bottleneck in the global input to the cells, especially with extremely large arrays, or while displaying hard-to-compress patterns, and while compressed data streams require less power to transmit and process than uncompressed streams, having every cell process every opcode is still inefficient in terms of power use and heat production. Another embodiment of the present invention as shown in FIGS. 6A and 6B therefore extends the previous embodiment by replacing the global inputs 502 with means for communication with neighboring cells 602. The array 60 is composed of rows of direct output cells 600 where each cell can receive information from the cell "before" it, process the information received and send the processed information to the next cell. Adder 608 and count register 610 can be identical to adder 508 and count register 510 of the previous embodiment. Decoder 606 replaces decoder 506 for handling the decompression opcodes. In situations where it is advantageous to have all cells identical, a separate initiator 64 can be used to pass information to the first cell in each row. In some cases it may be advantageous to have input a single data stream to the whole column of fast initiators, and to have the initiators split out the input for each row from that data stream.

As in the previous embodiment, there are many compression schemes that can be used. The scheme used in the previous example has been used here for consistency. While the compression opcodes are the same as those used in the previous embodiment, the processing is quite different. A reset (RES) opcode is always passed on to the next cell. After a reset opcode each cell 600 looks at the first opcode it receives. For COB and NCOB, it takes the immediately following data as its new value for direct output means 604. For COB it then removes the opcode and data from the stream, while for NCOB it decrements the cell control count N and only if N is zero does it remove the opcode and data from the stream. For NCRU, the cell's direct output means 604 remains unchanged, and the cell decrements the counter N and if N is zero it removes the opcode and data from the stream. The processing of the output datum that the cell receives can be identical to the previous embodiment, but this embodiment has several advantages. A separate input 62 and/or initiator 64 is used for each row of cells, which removes the potential input bottleneck, and no addresses are needed by the cells, allowing all array cells to be identical. The disadvantage is that the connection to the data source will be more complex, consisting of many separate inputs 62, or that separate fast initiators will be needed, which may require a more complex manufacturing process.

Even when the display is fabricated on the same substrate as other parts of the system, the display is essentially still a separate device for which data must be gathered and to which data must be sent. Having non-display regions on the same substrate as the display also reduces percentage of the substrate area that can be devoted to the display, at least until production technology supports multiple layers of complex circuitry (in contrast to memory and processing, larger physical dimensions are often advantageous for a display). The fault tolerant architecture of the present invention, can support cells with a variety of useful properties, allowing display, memory, and processor functions all to be supported by the same spare cell scheme. Integrating the system's main memory array with its display array would be highly advantageous because this memory makes up the bulk of a typical system's circuit count. Integrating this memory with the display array thus allows the display to cover most of the substrate area.

The fault tolerant monolithic data processing architecture according to another embodiment of the present invention therefore integrates the display and main memory for a system into a single array with a highly redundant monolithic network of cells that can be organized into a regular fault-free array of cells, where the array cells contain both one or more direct output elements and sufficient memory so that the array as a whole contains at least half of the system's active same-substrate memory. This can be accomplished without interfering with the array's defective pixel tolerance by using a cell size less than the visible-optical-defect limit of 50 microns. At the density of today's 16 Mbit DRAM's, this would limit cell size to approximately 256 bits per cell, with sufficient circuitry to support one pixel or 3 sub-pixels, and connections for a redundant scheme such as that shown in FIG. 1A. Due to the small cell size the raw cell defect rate should be under 0.025%, even with a leading edge lithography. The 3-or-1 redundancy provided by the spare cell arrangement of FIG. 1A is sufficient to provide an extremely high yield at this low raw error rate. With 3 color sub-pixels per cell, a 6 million-cell array would pack a 8-times-better-than-SVGA display and 48 MBytes of fast memory onto a single 8-inch wafer.

Arrays of larger cells would be more efficient in many cases than arrays of 50 -micron or smaller cells because more of the area could be devoted to cell contents, as opposed to intercell connections for fault tolerance and to the rest of the system. In output arrays where the cell size exceeds the threshold for defects apparent to the human eye (or other receiving device), however, spare cells that have their own pixels will be obviously out of alignment when they replace array cells. While the cells in previous display embodiments of the present invention can be made small enough to hide such defects, cells containing kilobytes of memory or RISC processors are far too large at today's lithography for such a scheme.

Figure 7A:
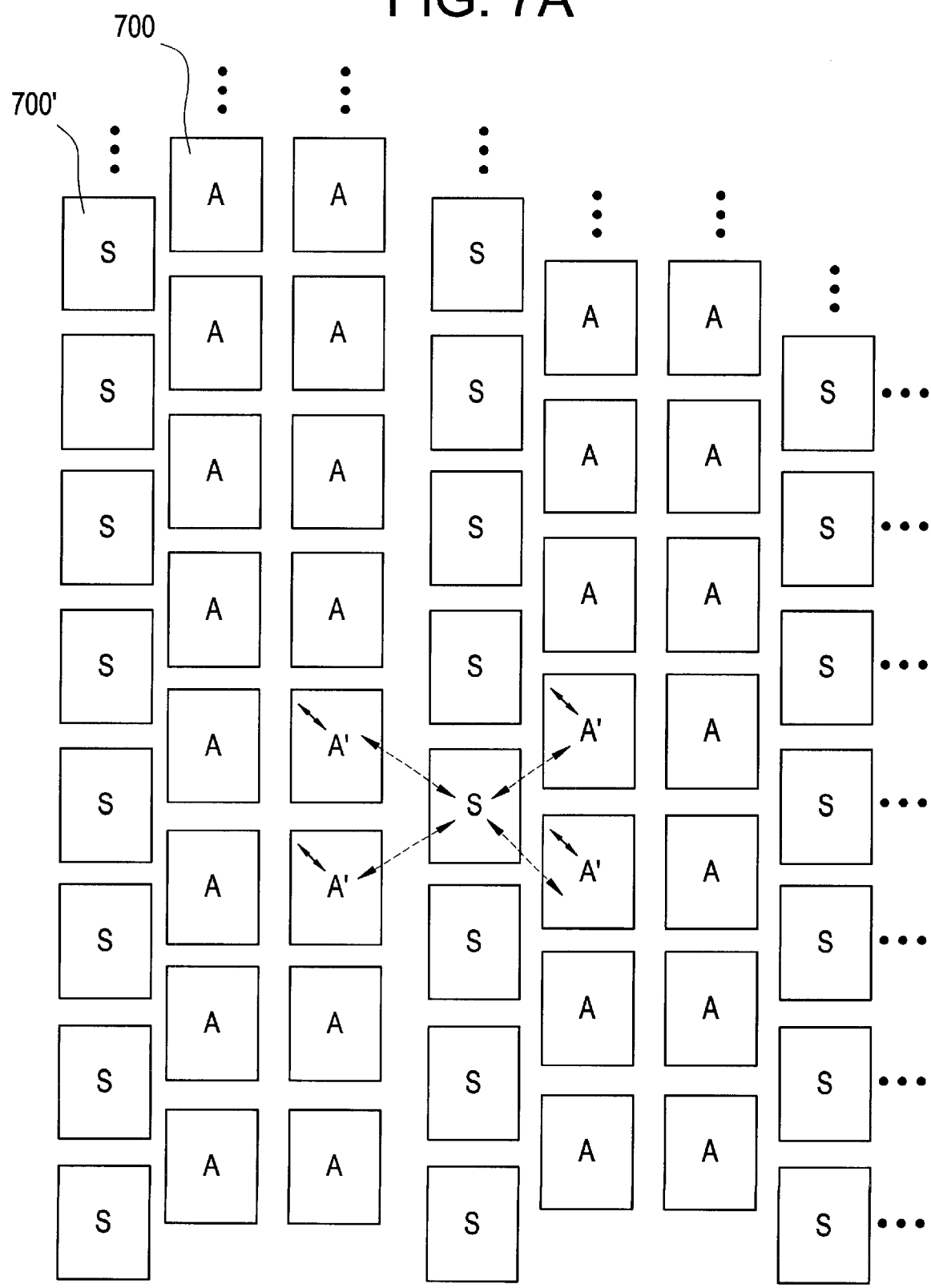
FIG. 7A is a functional depiction of a spare cell capable of using the direct outputs of any array cell it replaces.
Figure 7B:
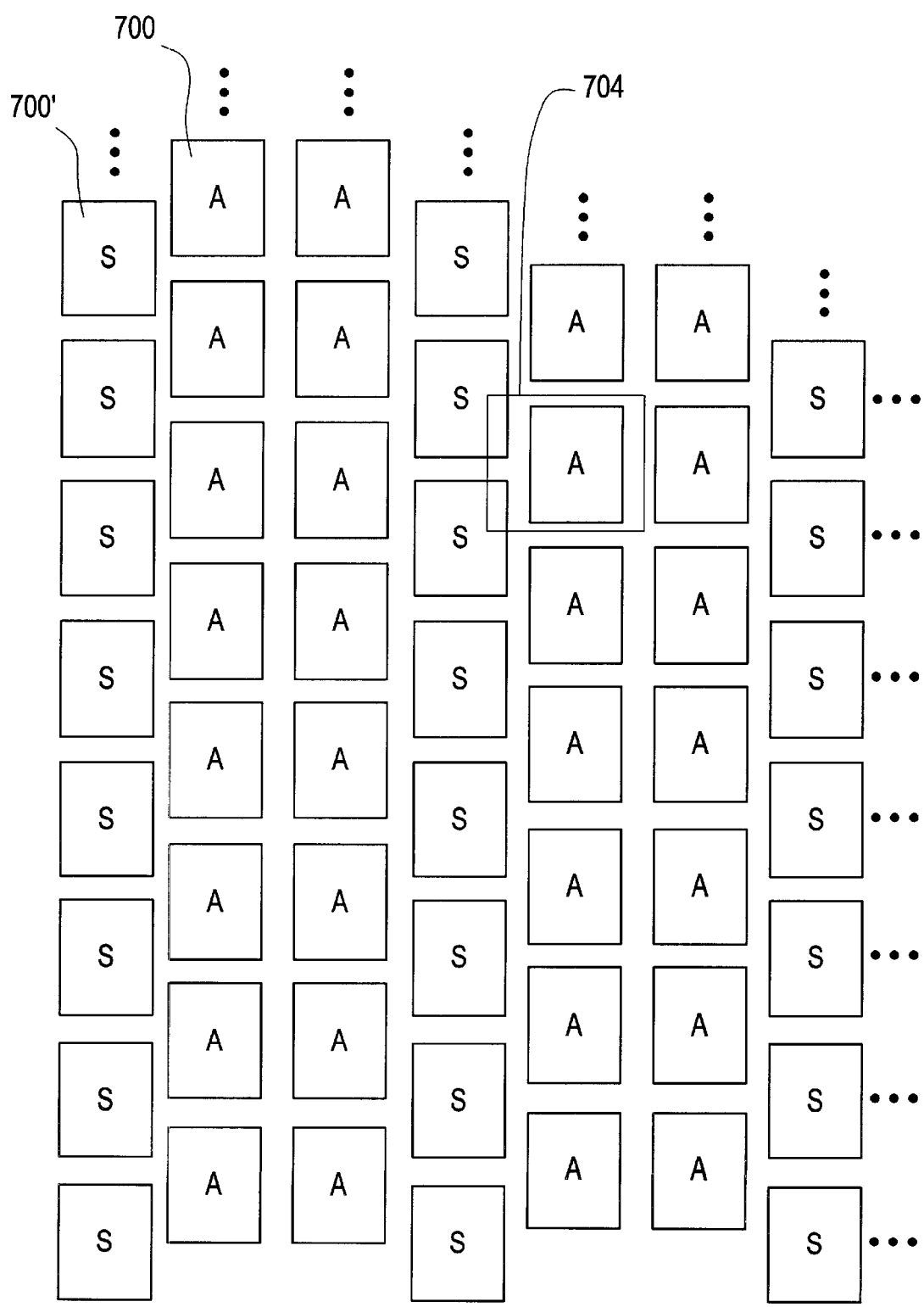
FIG. 7B is a geometric depiction of the area occupied by the direct outputs of an array cell when a spare cell that may replace it will use those direct outputs.

The fault tolerant architecture according to a further preferred embodiment of the present invention therefore provides a highly redundant network of cells that can be organized into a regular fault-free array of cells, where the array cells contain one or more direct output elements, and where spare cells 700' have the capability to control an array cell's display pixels when they replace that array cell 700, as shown in FIG. 7A. This lets the array appear uniform to the eye (or other receiving device) even when defective array cells are replaced by keeping the spare cell's output lined up with the cell that would normally have produced it. One low-power way to do this is to have defective cells disabled by cutting off their power supply, and by using multi-input 'OR' gates on the array cell's display control lines, where each 'OR' gate has an input from the array cell and from each spare cell that might replace it. Because spare cells 700' in this embodiment do not need pixels of their own, the direct output pixels 704 of an array cell 700 can overlap the spare cells around it so that combined pixels of the array cells can cover substantially all of the surface of the whole network, as shown in FIG. 7B. This especially important with low-power optical output means that reflect or refract ambient light, such as microscopic mirrors ("At TI, HDTV Is All Done With Mirrors", The Wall Street Journal, Jun. 10, 1993), because it increases the percentage of ambient light that can be controlled. Cells larger than the visible-optical-defect size can also have more processing power, which allows more sophisticated compression schemes to be used. Sufficient processing power for a cell to figure out which of its pixels fall within a triangle, for example, allows the array to process shaded triangles directly rather than requiring the main CPU or a separate graphics accelerator process them, and sufficient processing power to handle textures allows textured polygons to be used, etc.

With spare cells using the pixels of the cells they replace, however, the defective pixel tolerance is lost. While for some applications a defective output pixel would not be as serious as a defective processor or memory, in other applications the need to avoid defective pixels would limit array size in the absence of defective-pixel tolerance. For these applications the previous embodiment is only useful for displays that can be made without defective pixels, which would currently limit the display to a few million pixels. It would thus be extremely advantageous to restore the defective pixel tolerance for macroscopic cells.

The fault tolerant monolithic data processing architecture according to another embodiment of the present invention therefore overcomes the output array size limit for arrays of macroscopic cells with a highly redundant monolithic network of cells that can be organized into a large regular fault-free array of cells where each cell has direct output means including spare pixels as well as means for memory and/or means for processing. In order for spare pixels to be useful the maximum distance between a spare pixel and the pixel it replaces must be small enough so as not to cause an inconsistency noticeable to the receiver. For the human eye at a comfortable viewing distance, this is around $1/500$ of an inch (0.05 mm), although with a blurring mask 0.1 mm would be acceptable. The architecture disclosed in the present invention can support output to vast numbers of pixels, and displays with pixels smaller than $1/500$ inch are already in production. With the fault tolerance that the architecture of the present invention supplies, it is anticipated that pixels could be made as small as the memory that controls them. A typical implementation with today's lithography would use cells that nominally have 4096 pixels arranged in a 64×64 matrix, but actually have 72×72 pixels, with the pixels addressed by row and column pixel lines in a manner similar to the word and bit lines of memory chips. During normal operation, each 9th line would be an "extra" line. The extra lines could be programmed to be blank, leading to a barely noticeable "stippled" effect, or to display the average of their neighboring lines at every point, producing a smoother looking display, or even to alternate between their neighboring lines' values. When replacing a line containing a defective pixel, the nearest spare line would take on its neighbor's values, leaving that line free to in turn take on its neighbor's values, until the defective line was reached. With the example above and 0.05 mm pixels, this would cause a 0.05 mm shift in the pixels in a region 3.6 mm by 0.05–0.2 mm, which is unnoticeable to the unaided eye from a normal viewing distance. This provides a display many orders of magnitude more error tolerant than today's absolute-perfection-required displays. The length of the shifted area can be halved when necessary by dividing a cell's direct output pixels into quadrants with control circuitry around the perimeter instead of on just two sides. It is also be possible to use a somewhat more sophisticated pixel-level fault tolerant scheme. While the fault tolerant scheme of U.S. Pat. No. 5,065,308 is not suitable for the cell array as a whole, it could easily be adapted to provide fault tolerance for each individual cell's pixels by treating each pixel as one of its cells. With 0.5 micron lithography this would, unfortunately, consume roughly $1/3$ of the cell's total circuit count, but improvements in lithography should reduce this to an acceptable fraction within in less than a decade. Although these spare pixel schemes do have multiple pixel shifts per defective pixel, the shifts are only the length of a single pixel instead of the length of a whole cell, and the shifts are bounded by the nearest spare line or the relatively nearby edge of the cell rather than by the potentially far more distant edge of the whole array.

Figure 8A:
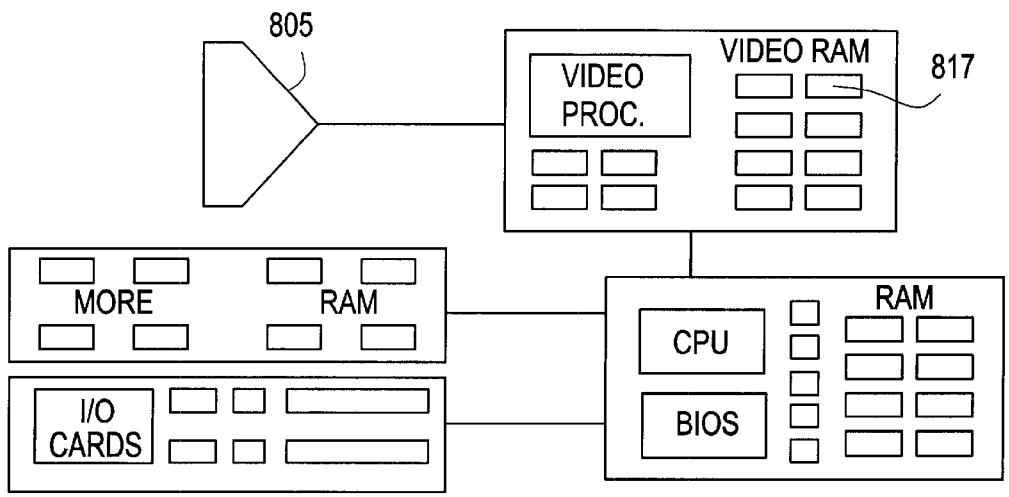
FIG. 8A is a functional depiction of the physical parts of a classic serial data processing system.
Figure 8B:
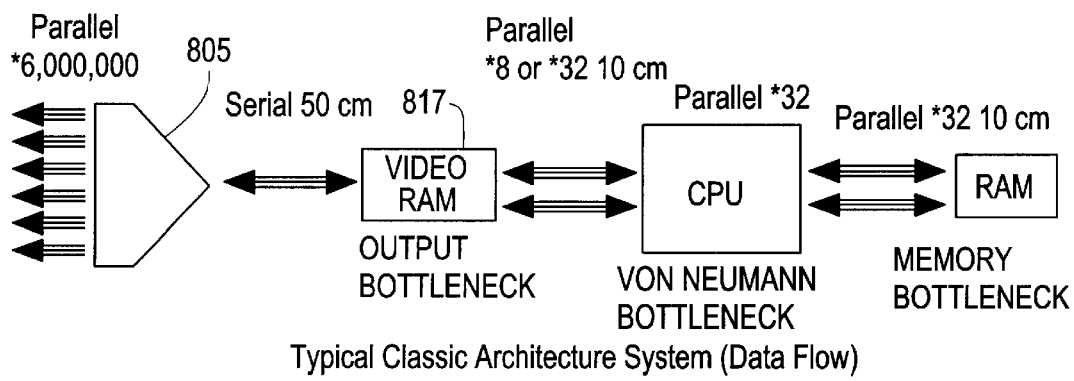
FIG. 8B is a functional depiction of the data flow of a classic serial data processing system.
Figure 8C:
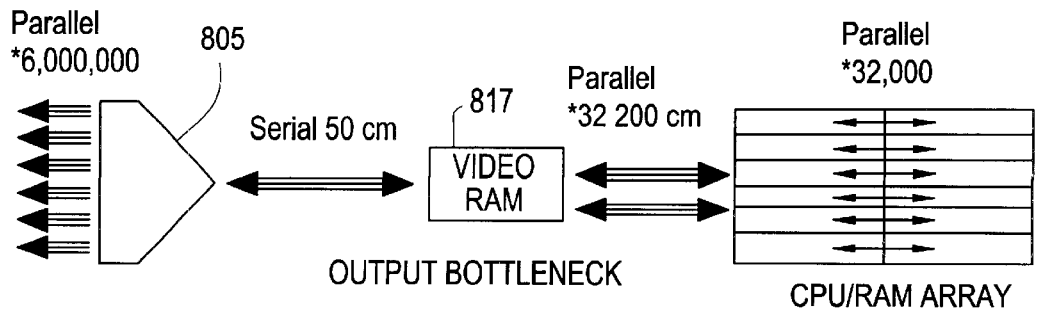
FIG. 8C is a functional depiction of the data flow of a classic massively parallel data processing system.

Because traditional computer architectures use separate devices for processing and output, increases in output resolution such as the preceding embodiments of the present invention increase the amount of output that must be gathered, coordinated, and transmitted to the output device, especially for output intensive tasks such as full-color, full-motion video. Use of a separate output device also dramatically increases the electrical power required to send the information to the output device. A typical present-day desktop or notebook system, as shown in FIGS. 8A and 8B, stores data for its display 805 in a separate dedicated "VRAM" memory 817, from which the information for hundreds of thousands of pixels is gathered together, serialized, and sent through a path tens of centimeters long to reach the display, where the information is then spread out across the pixels of the display. While the extra power required is small in mainframe or desktop computer terms, it is significant in battery powered portable computers. Even today's parallel processing systems, which generate image pixels in parallel and store them in memory in parallel, serialize the data for transmission to a display 805, as shown in FIG. 8C. Once at the display, the data are then spread out across its surface. While this scheme is tolerable when a single or small set of fast and expensive processors is performing compute-intensive operations on serial processing tasks, many parallel processing tasks are both output-intensive and compute-intensive. As the number of processors increases, the gathering and coordination of the output of the processors for transmission to a separate output device becomes a limiting factor. The human eye can handle optical information roughly equivalent to 100 trillion bits per second, or 10,000 times more than today's best computer displays, so tasks such as human-eye-quality video will be beyond separate displays for some time to come, even with compressed data and multiple inputs to the display.

Figure 9A:
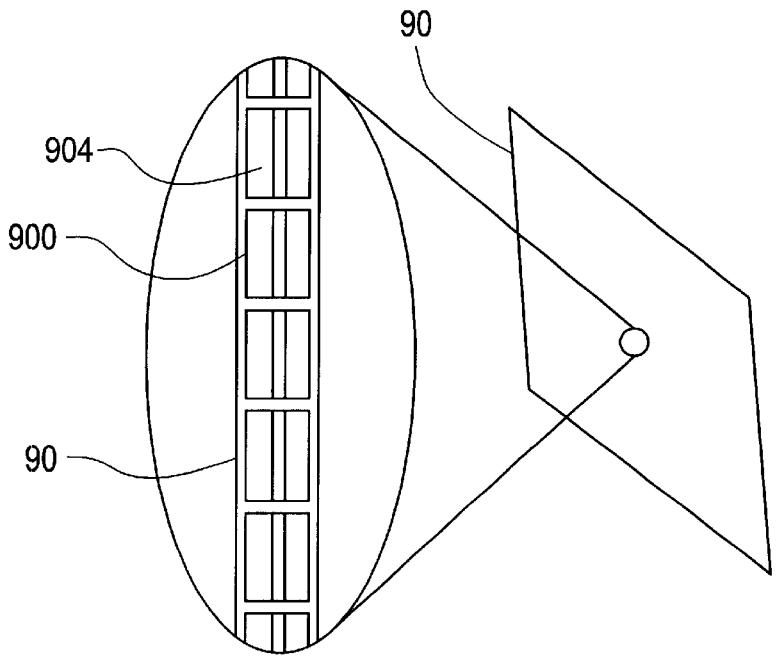
FIG. 9A is a functional depiction of the physical parts of an integrated massively parallel data processing system according to the present invention.
Figure 9B:
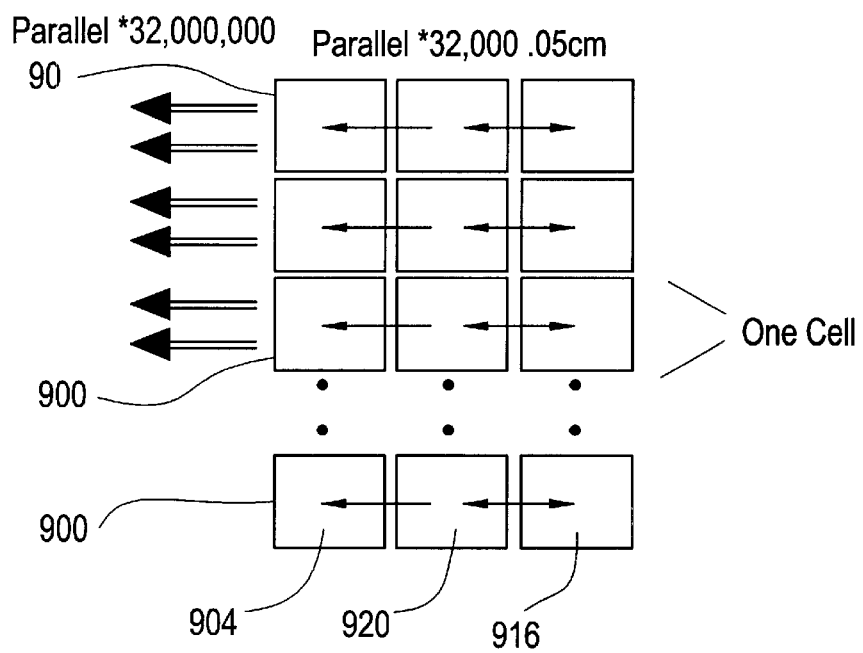
FIG. 9B is a functional depiction of the data flow of an integrated massively parallel data processing system according to the present invention.

The fault tolerant monolithic data processing architecture according to another embodiment of the present invention as shown in FIGS. 9A and 9B therefore overcomes need to serialize output data at ANY stage with a highly redundant monolithic network of cells that can be organized into a large regular fault-free array 90 of cells 900 where each cell has direct output means 904 as well as means for memory 916, means for processing 920 and means for input. While processor 920 may be more complex than a RISC microprocessor, extremely simple processors are also suitable with the array architecture of the present invention. At a minimum each processor 920 should contain an instruction decoder, an arithmetic/logical unit, at least one register, and a memory fetch/store unit, allowing the array to handle a neural network program; other advantageous levels of memory and processing power correspond to those discussed in previous embodiments of the present invention. By far the most useful sort of direct output means 904 is optical output means, although direct sonic and infra-red output will have uses as well. While it is possible to have the direct output means 904 placed between the cells and shared by neighboring cells in a manner similar to the shared memories of U.S. Pat. Nos. 4,720,780 and 4,855,903 (this is equivalent to having NO dedicated "array" cells, so that a "spare" cell must be used for every array cell position), providing each cell 900 with its own direct output means 904 can produce better performance with simpler lithography. A processor/output array so designed allows each processor to manage its own portion of the display without the need for involving other processors or a global bus. This avoids the complexity of having a multitude of electrical connections between the processor array and external output devices, as well as allowing the array to be expanded indefinitely without an output bottleneck.

Traditional computer architectures use input devices separate from their output, processing and memory subsystems. A few devices, such as touch-sensitive screens, combine input and output, reducing system size and increasing convenience. This combined I/O device, though, is still separate from the rest of the system. A standard touch screen is also a global input to a system, which would not allow concurrent inputs to separate regions of the processing arrays disclosed in the present invention. Furthermore, while input is generally not as data intensive as output in todays systems, tasks such as machine vision may soon brine it to comparable same levels. While direct input arrays that do analog filtering have been pioneered by Carver Mead, et al., these arrays rely on external devices for general image processing, and the size of these arrays is limited by lithographic errors, so systems based on such arrays are subjected to off-chip data flow bottlenecks and the cost, size, and power penalties of macroscopic connections.

Figure 10:
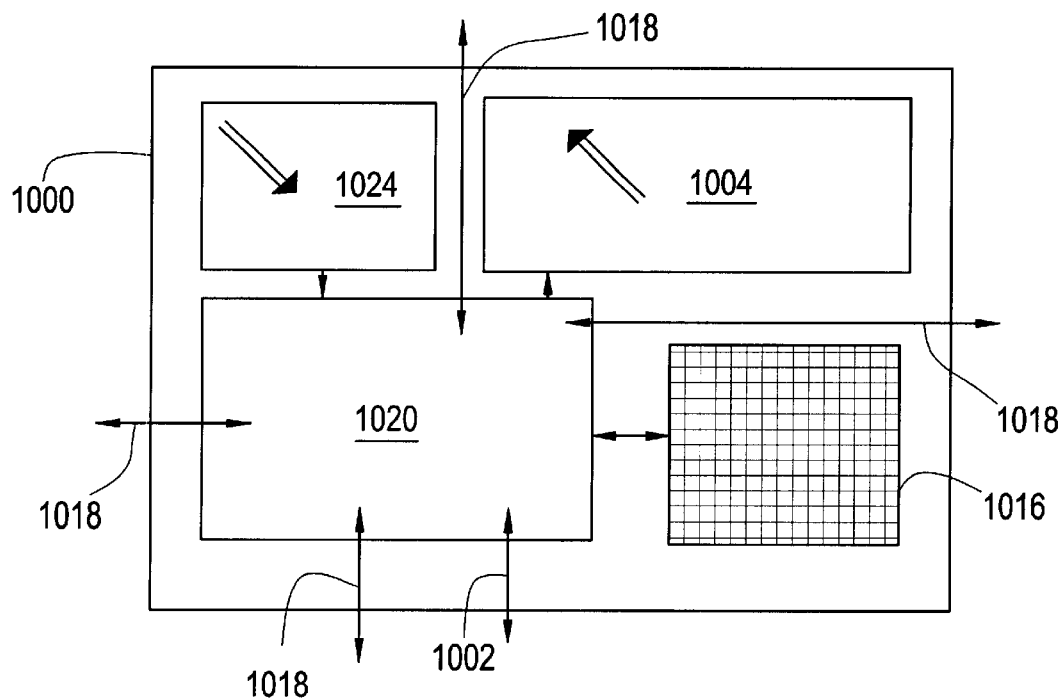
FIG. 10 is a functional depiction of an array cell with direct output means and direct input means.
Figure 11:
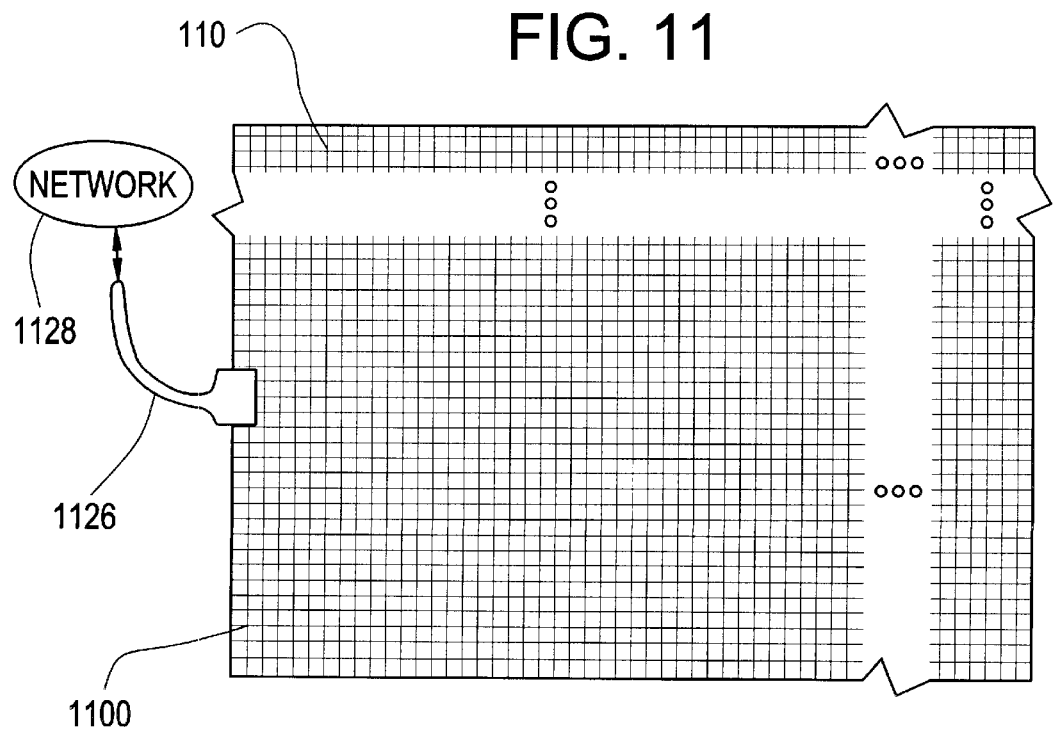
FIG. 11 is a geometric depiction of an array of processing cells using their direct inputs and outputs to communicate with an external device.

In a further embodiment of the parallel data processing architecture according to the present invention as shown in FIG. 10, each array cell 1000 has both direct input means 1024 and direct output means 1004 as well means for memory 1016 and processing 1020. Access 1002 to a global data bus and means 1018 for communication with neighboring cells are usually useful additions to this embodiment as well. Useful types of direct input means 1024 include, (but are by no means limited to) optical, sonic, infra-red, and touch/proximity. Having the cells equipped with both direct input means and direct output means allows the array to handle input intensive tasks without encountering an input bottleneck and gives the cells the ability to interact with the outside world in a variety of ways. With optical direct output means and touch/proximity direct input means, for example, a portion of the array can "display" itself as a keyboard for any language, and data can be entered by typing on the "keys". Then, when more area is required for the output, that section of the array can "become" part of the output display. This is not practical with a global touch input because input from inactive fingers resting on the "keyboard" would be added to the input from the active "key". With a multitude of direct inputs, however, the "keyboard" can determine which fingers have moved by how much, and thus which key is being selected. Direct touch inputs also allow different regions of the display to act as independent touch screens without involving the rest of the system. Having both direct input means and direct output means as shown in FIG. 11 allows input and output between the array I/O and separate devices 1128, such as mass storage systems or network interfaces, to be done through devices 1126 that are placed in proximity to the array and communicate through the cells' direct inputs and outputs. For example, such a device 1126 could have optical or infrared inputs and outputs for communicating with the array combined with a telephone jack for communicating with the telephone system. This allows the array to use external input and output devices without physical connections to those external devices, reducing total system complexity, fragility and costs.

A further significant advantage of these embodiments is that they allows up to an entire data processing system to be produced by the repetition of a single simple unit. This not only simplifies production, but it is extremely significant in lowering design costs, which run up to hundreds of millions of dollars for today's sophisticated chips, Even including redundancy support, the repetitive unit in this embodiment can have two or more orders of magnitude fewer unique circuits than today's chip-based systems, reducing design costs by a proportional (or greater) amount. Yet an other significant advantage of these embodiments is that each array cell is a computer system where all its resources, including its share of the input and output of the array as a whole, are within a centimeter or even within a millimeter, greatly reducing the power required and heat produced in moving, data within it. Combining, complementary direct input means and direct output means is especially preferred; this also allows arrays to communicate extremely rapidly with each other when placed face to face. Using optical direct input means and light-emitting direct output means as the complementary means is even further preferred, as this allows the array to scan documents by emitting light through these direct outputs and receiving the reflected light through these direct inputs. While for many type of I/O the advantages of direct I/O from each cell are overwhelming, this does not preclude adding means for other types of I/O, especially those whose resolution is on the scale of a whole array or larger rather than that of an individual cell, to the cell network as a whole as opposed to each cell. With rectangular arrays on round wafers this can be a good use for the considerable space around the edges of the arrays. Types of I/O suitable for this include, but are not limited to, acceleration, position and orientation detectors, sonic detectors, infra-red or radio signal detectors, temperature detectors, magnetic field detectors, chemical concentration detectors, etc.

Figure 12:
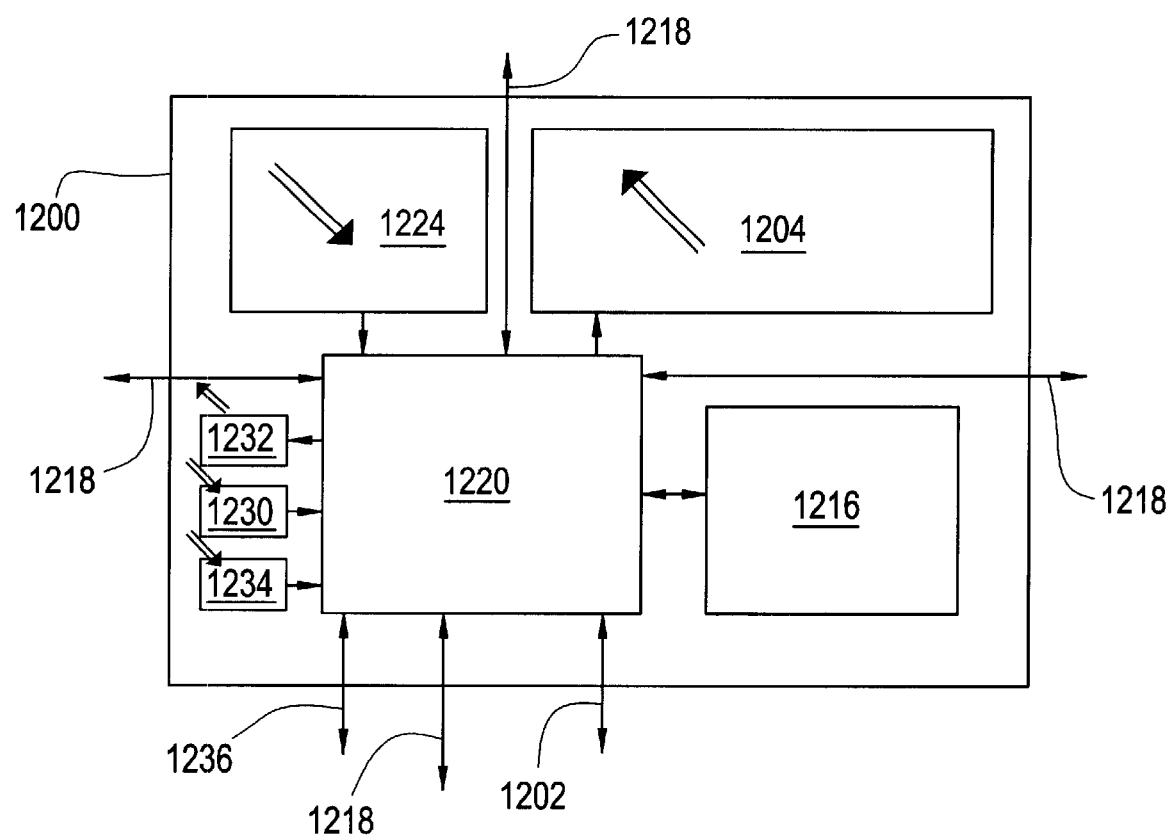
FIG. 12 is a functional depiction of one processing cell with several kinds of direct input and direct output.

In a further embodiment of the parallel data processing architecture of the present invention, as shown in FIG. 12, each array cell 1200 is equipped with input and output means 1202 to a global data bus, means 1218 for input and output communication with each of its neighboring cells in at least two dimensions, sufficient memory 1216 and processing power 1220 to decompress a data stream and to emulate at least any one instruction from a RISC or CISC microprocessor instruction set, full color 1204 direct output means and full color 1224, capacitance touch/proximity 1230 direct input means, global and/or direct sonic input means 1234 and output means 1232, and means 1236 to join a regional data bus. This combination allows the array, in conjunction with network interface devices and appropriate storage devices (which need not be physically connected to the array), to function as a super high resolution TV, a standard sonic and full color picture telephone, a document scanner and facsimile machine, and a voice, vision and touch activated supercomputer that is compatible with existing serial software.

Systems that use wireless links to communicate with external devices are well known in the art. Cordless data transmission devices, including keyboards and mice, handheld computer to desk-top computer data links, remote controls, and portable phones are increasing in use every day. But increased use of such links and increases in their range and data transfer rates are all increasing their demands for bandwidth. Some electromagnetic frequency ranges are already crowded, making this transmission bottleneck increasingly a limiting factor. Power requirements also limit the range of such systems and often require the transmitter to be physically pointed at the receiver for reliable transmission to occur.

Figure 13:
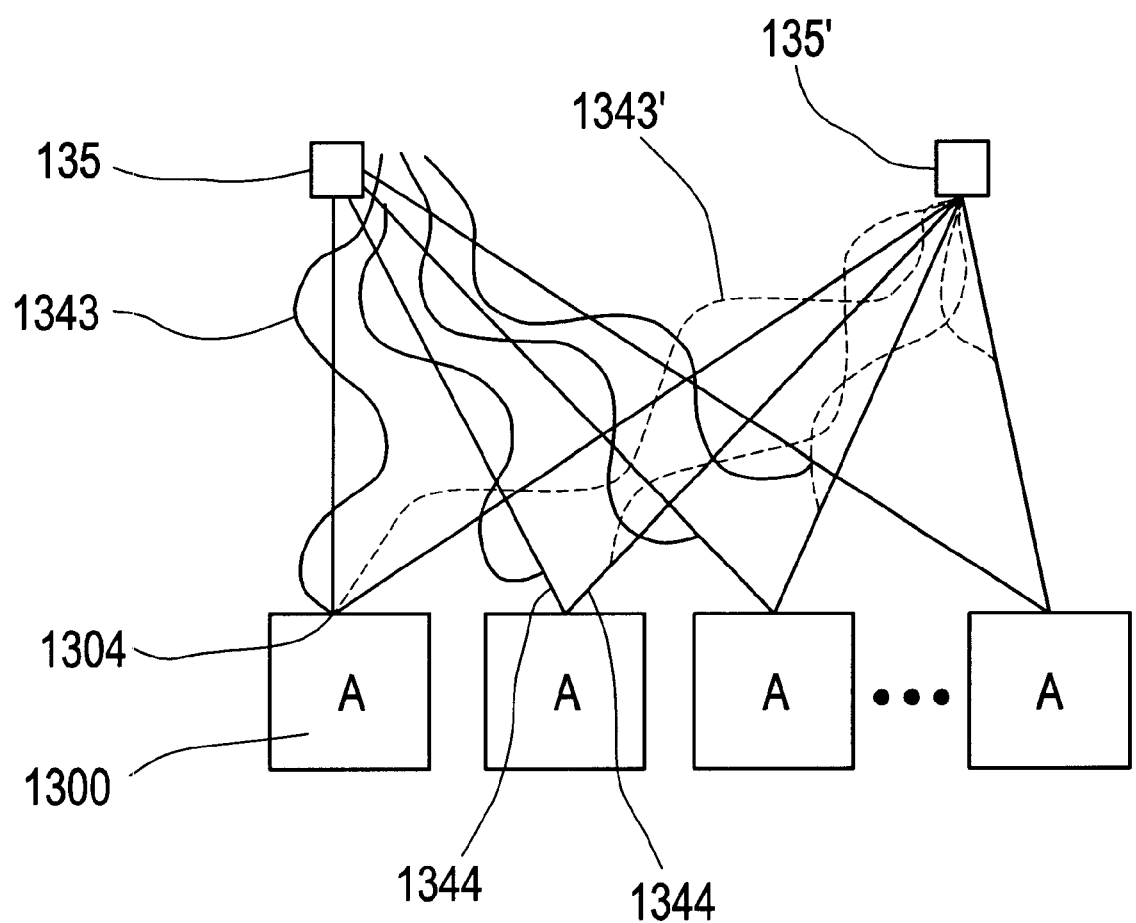
FIG. 13 is a functional depiction of several cells using their direct output means as a phased array to focus on an external receiver.

The fault tolerant monolithic data processing architecture according to another embodiment of the present invention overcomes the output array size limit with a highly redundant monolithic network of cells that can be organized into a large regular fault-free array of cells where each cell has means for input and output to a global data bus and direct input and/or output means as well as means for memory, and means for processing, and means for coordinating the phase and/or timing of the cell's direct inputs and/or outputs with those of other array cells. This allows the array of cells 1300 to act as a "phased array" for focusing on an external transmitter or receiver 135, as shown in FIG. 13. Spare cells that replace array cells in such an architecture can be useful in receiving or transmitting if they either have their own timing/phase control means or they use the replaced array cell's transmitting or receiving means 1304 (or if the maximum distance between a spare cell and the cell it replaces is small enough so as not to cause an inconsistency that interferes with reception or transmission). Because phased arrays by their nature involve sending or receiving the same signal through many cells, it is convenient to have the cells communicate through a global or regional data bus.

A further embodiment dynamically focuses on the external device through a differential timing circuit. For direct outputs whose signal propagation is slow compared to the speed of the global data bus, such as sonic direct output element s receiving data from an electronic bus, a simple way to implement the differential timing circuits is as follows: One cell (or a device associated with the array) is the target or source of the signal to be focused. This cell or device will be referred to as the controller. The external device to be focused on sends a short reference signal strong enough for each array cell to pick individually. When the controller picks up this signal, it waits long enough so that all the cells will have received it, and then sends its own reference signal across the global data bus. Each cell measures the delay time between when it receives the external reference signal and the reference signal on the global data bus. When all the cells receive data to be transmitted from the global data bus, each cell delays for its delay time before transmitting that data. The cells that received the external reference signal later have shorter delay times, and thus send the data earlier. This causes the transmissions from all the cells to arrive at the external device simultaneously and in phase, effectively focusing the overall transmission upon it, as shown in the solid-line waves 1343. The cells' transmissions will not add constructively, and hence will not focus, at most other points 135', as shown by the dashed line waves 1343' (the cell timing delay difference for one cell is indicated by identical-length segments 1344).

The same timing works when the cells receive data, too. Each cell delays (by its delay time) before putting received data on the global bus, so cells that receive their data later delay shorter times and all signals from the source get added together on the bus. With signals from sources other than the one being focused on, the signals do not all arrive in phase, so their effect is much reduced. When receiving data, once the focusing is established it can be maintained even if the external device moves by each cell checking its timing against the collective global signal. This focusing should lead to vast improvements in areas such as voice input to computers, which currently suffers from a very difficult time picking out a given voice from background noise. With a dynamically focusing array to receive the sound input and a processor array to interpret it, computer speech recognition should be practical in a wide variety of real-world situations.

This phased array technique can also be adapted to direct outputs whose external signal propagation speed is comparable to or greater than that of signal propagation on the global bus, such as radio transmission. First the timing of the global bus must be taken into consideration. If the same cell or device is always the controller, the time for data to reach a given cell is a constant that can be controlled at manufacturing time; probably the easiest way is to provide paths of equal length to every cell, either for the global data bus or for a separate timing signal. If the global bus timing cannot be compensated for at manufacturing time, an arrays containing an orientation detector can calculate the bus timing for each cell by comparing calculated delay times for various orientations (the bus timing remains constant regardless of orientation, while the propagation timing does not). For electromagnetic radiation, however, the required delay times are too small for any current technology, but the phase angle of the output can be controlled instead. This is most effective for frequencies whose wavelength is at least twice the width of a single cell, but less than four times the width of the entire array. For wafer sized or larger arrays and electromagnetic radiation, this covers the VHF and UHF TV bands. Arrays smaller than a credit card would achieve only limited focusing of VHF signals, but would still work well in the UHF band. An especially preferred embodiment would combine direct phased array receiving mean s for such signals with sufficient processing power to decode standard TV or HDTV signals and sufficient optical outputs to display a complete standard TV or HDTV picture, as this creates a compact, low-cost, low-power, monolithic TV system.

One of the most important kinds of data to focus, however, is optical data, and the frequency of optical signals is so high that even direct phase control for focusing is currently impractical. Directional control of optical signals, however, is practical. For constant focusing it is easy to mould a pattern of small lenses on a plastic sheet that can form the surface of an output or input array, as is done in SONY's Visortron. This is especially useful for head-mounted arrays because these can be held at constant, predetermined orientation and distance from the viewer's eyes, and because they can be close enough to have each cell's pixels visible by only one eye, eliminating the need for a single cell to direct different images to different eyes. For non-head-mounted displays, fixed-focusing can be used to allow images to have some apparent depth as long as the display is held at approximately the right distance and orientation) by having different pixels directed toward each eye.

Dynamic focusing, however, has numerous advantages over fixed focusing. For non-head-mounted displays, adding directional control to the cells' optical outputs allows the array to present a stereoscopic image regardless of viewing angle and distance. Control of focal length is even more advantageous, as it allows displays, whether head mounted or not, to "almost focus" in such a manner that the receiving eye's natural focusing will causes the eye to "see" those pixels as being at a given distance, thus producing true 3-dimensional images as far as the eye can tell. Further embodiments of the present invention therefore include means for optical input and/or output in each cell along with means for that input and/or output to be dynamically focused. This can be accomplished through holographic lenses, which have been pioneered for 3-dimensional optical storage systems ("Terabyte Memories with the Speed of Light", BYTE, March 1992). Because each cell can have enough processing power to control a holographic lens to focus on a given point, the array as a whole can focus on that point. Since each cell can focus independently, separate regions of the array can also focus on different points. While holographic lenses are likely to prove most practical in the short run, other focusing methods would be applicable. A fly's eye, for example, uses physical deformation of a gelatinous lens to focus each cell on a point of interest to the fly, and a similar scheme on a wafer could use cantilevered silicon beams or piezoelectric materials deformed by electrical forces.

Current computer systems are made from a number of separately manufactured components connected together and placed inside a plastic or metal box for protection. This creates a system many orders of magnitude bigger than the components themselves. But the present architecture allows all lithographically fabricated components, from input and output to memory and processors, to be integrated on a single substrate, leaving only the power supply and mass storage systems as separate devices. Because the present architecture reduces power consumption, it should be feasible to power a system based on it through batteries and/or photovoltaic means. Both thin-film photovoltaic cells and thin high-performance lithium batteries can be produced on wafer production lines ("Thin-film Lithium Battery Aims at World of Microelectronics", Electronic Products, December 1992), allowing their integration into the architecture of the current invention with today's technology. It is also possible to lithographically fabricate an individual battery (or other power storage means) and/or photovoltaic means for each cell so that ALL system components have at least the same cell-level redundancy and no fault will interfere with the proper operation of more than a few directly replaceable cells. In such embodiments it would advantageous for cells to be able to join with their non-defective neighbor in a regional power-sharing bus. In an ideal embodiment ambient light that was not reflected as part of the direct output would be absorbed by a photovoltaic cell, and the system would go into a power-absorbing standby mode when left idle for a given period of time. If equipped with sufficient photovoltaic receptor area, a carefully designed array could be powered entirely by ambient light, eliminating the need for external power supplies and creating a completely self-contained monolithic system, although it is expected that in practice additional global connections for an external power source will be advantageous in most cases.

While systems based on the previous embodiments of the present invention represent significant advances in input, processing, memory, and output, semiconductor wafers are fragile and limited in size. It is, however, possible to transfer a thin layer of crystalline silicon including completed circuitry from the surface of a wafer to another substrate, including a flexible one such as a tough plastic ("Prototype Yields Lower-Cost, Higher Performance AMLCDs", Electronic Products, July 1993, and "Breaking Japan's Lock on LCD Technology", The Wall Street Journal, June 1993). By placing a plurality of such transfers contiguously onto a large semi-rigid substrate, and then interconnecting the transfers through alignment insensitive contacts (such as those shown in FIG. 4E) in a final metal layer, a system of any size needed could be produced. If such a system were covered with a protective plastic layer, the whole system would be a extremely tough and durable. Because the present invention teaches integrating an entire system on the surface of a wafer, circuit transfer will allow an entire system according to the current invention to be reduced to a tough, durable, light-weight sheet as thin as a fraction of a millimeter, although sheets approximately as thick and stiff as a credit card are expected to be ideal for most uses.

A further embodiment of the fault tolerant monolithic data processing architecture of the present invention therefore overcomes the wafer size limit with a plurality of highly redundant monolithic networks of cells that can each be organized into a large regular fault-free array of cells where each cell has direct optical output means as well as means for memory and processing, and where the monolithic networks are affixed close to each other on a substrate and the networks are subsequently connected to each other to extend the inter-cell connection patterns across the inter-network boundaries. More preferred embodiments use a non-fragile substrate. Although the inter-transfer connections can only be made on one metal layer instead of the up to five metal layers currently practical within a given transfer, an order of magnitude more connections can still be made to one side of a 3 mm cell as off-chip connections can be made to the whole perimeter of a standard-architecture a 15 mm chip. Arrays based on the present invention should be ideal candidates for such transfers because their defect tolerance allow s them to survive rougher handling than traditional circuitry. Circuit transfer will also be useful in adding additional thin memory or processing layers to systems built according to the present architecture. This is expected to be especially useful in adding multiple low-power memory layers to compact diskless systems.

Current wafer based production systems are efficient for producing monolithic regions no bigger than wafers, but the architecture disclosed in the present invention can efficiently handle networks far bigger than a wafer. But circuit transfer techniques can be used for raw silicon as well as for completed circuits, so large areas of a substrate can be covered with monolithic transfers of crystalline silicon with only thin lines of inconsistencies between the transfers. By trimming and placing the transfers to 1/500 inch (50 micron) accuracy (the visible defect limit for the human eye) and bridging the inter-transfer gaps by metal layers during the fabrication process, these seams can be hidden between the cells. The architecture disclosed in the present invention lets cells or regions of cells be connected through alignment-insensitive contacts, allowing regions larger than a single production-line mask to be fabricated, and allowing multiple low-cost masks to be applied either sequentially or simultaneously. It is thus possible to perform all production steps for systems based on the architecture of the present invention, including lithography, on a production line based on a large or a continuous sheet of substrate, rather than on individual wafers. Similar production lines are currently used in the manufacture of continuous sheets of thin-film solar cells, although not with transferred crystalline silicon. Because of economies of scale, such continuous linear production should be far cheaper than individual-wafer based production and subsequent circuit transfer.

A further embodiment of the fault tolerant monolithic data processing architecture of present invention therefore overcomes the high wafer-based production costs with a highly redundant network of cells that can be organized into a large regular array of cells where each cell has direct optical output means and memory and processing means at least sufficient to decompress a compressed data stream, and where the cells form a highly-repetitive linear pattern, and where networks larger than a lithographic production mask are made using a plurality of mask-sized regions interconnected through alignment-insensitive contact means, thus allowing the network to be produced through linear production means. In some cases this embodiment can be enhanced through post-linear-production customizing. For a minimal-istic output array as shown in FIGS. 5A and 5B, for example, each row of cells can be fabricated using identical lithographic patterns, with the exception of the cell's address. Each cell contains an address region with 12 bits each for its X and Y array coordinates 512 and 512'. This makes address pattern 512 constant for every cell in a given column 52 (the direction of production), so these addresses can be formed with a constant pattern as part of the continuous production process. Because the other address pattern is constant for every cell in a given cell row 54 in a perpendicular direction, address pattern 512' is produced as a constant set of address lines which is then customized in a separate post-continuous-production finishing step using a constant pattern perpendicular the original direction of production. Customization can be performed, for example, by using a linear array of lasers or ion beams to selectively cut address lines in address regions 512', or by techniques used to customize field programmable gate arrays.

Current circuit production techniques involve growing large crystals of pure silicon, slicing those crystals into thin wafers, and polishing and cleaning those wafers before circuits can be grown on them or thin layers of silicon transferred from them. But integrated circuits can also be fabricated from amorphous and polycrystalline silicon, as opposed to mono-crystalline silicon, and both of these forms can be inexpensively deposited as a continuous thin layer of virtually any size on a variety of substrates such as glass or flexible plastics. This technique is currently used both to produce a substrate for inexpensive thin-film solar cells, and in the production of flat panel computer displays. It has not found uses in processors or memories, however, because these substrates are both far less consistent and have lower electron mobility than the more expensive monocrystalline silicon, making it difficult to fabricate circuits as small or as fast. Since circuit speed and chip size are major bottlenecks in today's computers, the slower amorphous and polycrystalline silicon integrated circuits have not been competitive with crystalline silicon in spite of their potentially lower fabrication costs. But through the use of highly parallel and massively parallel processing, wide data paths, integrated memories, direct input and output, and minimal distances between input, processors, memories and output, the architecture disclosed in the present invention maximizes overall system speed relative to circuit speed. The architecture of the current invention also supports sufficient fault tolerance to overcome inconsistencies in a substrate, and allows large areas of a single substrate to be integrated, and hence large numbers of circuits to be integrated even if the individual circuits themselves are larger. These qualities will allow inexpensive medium-performance computer systems to be produced on monolithic areas of amorphous or polycrystalline silicon. Amorphous or polycrystalline silicon systems built with today's lithography would be limited by low memory density to black-and-white or low-resolution color, and would be limited by slow circuit speeds to medium performance on serial tasks, but the principles remain the same and improvements in lithography should allow full-color implementations on these substrates within a few years. It is expected that crystalline semiconductor substrates will dominate where speed, resolution and/or compactness are most important, and amorphous or polycrystalline will dominate when a large display size is most important.

Portability is an increasingly important issue in computer systems. By integrating an entire data processing system in a microscopically interconnected region, the present invention greatly reduces the size, cost, and power requirements of the system. Such regions can also be fabricated on or transferred to flexible substrates, allowing complete one-piece computer systems to be built on non-fragile substrates. When provided with a thin, transparent protective surface layer, such a system can be extremely rugged, being essentially shockproof and potentially even waterproof, as well as being compact.

Figure 14A:
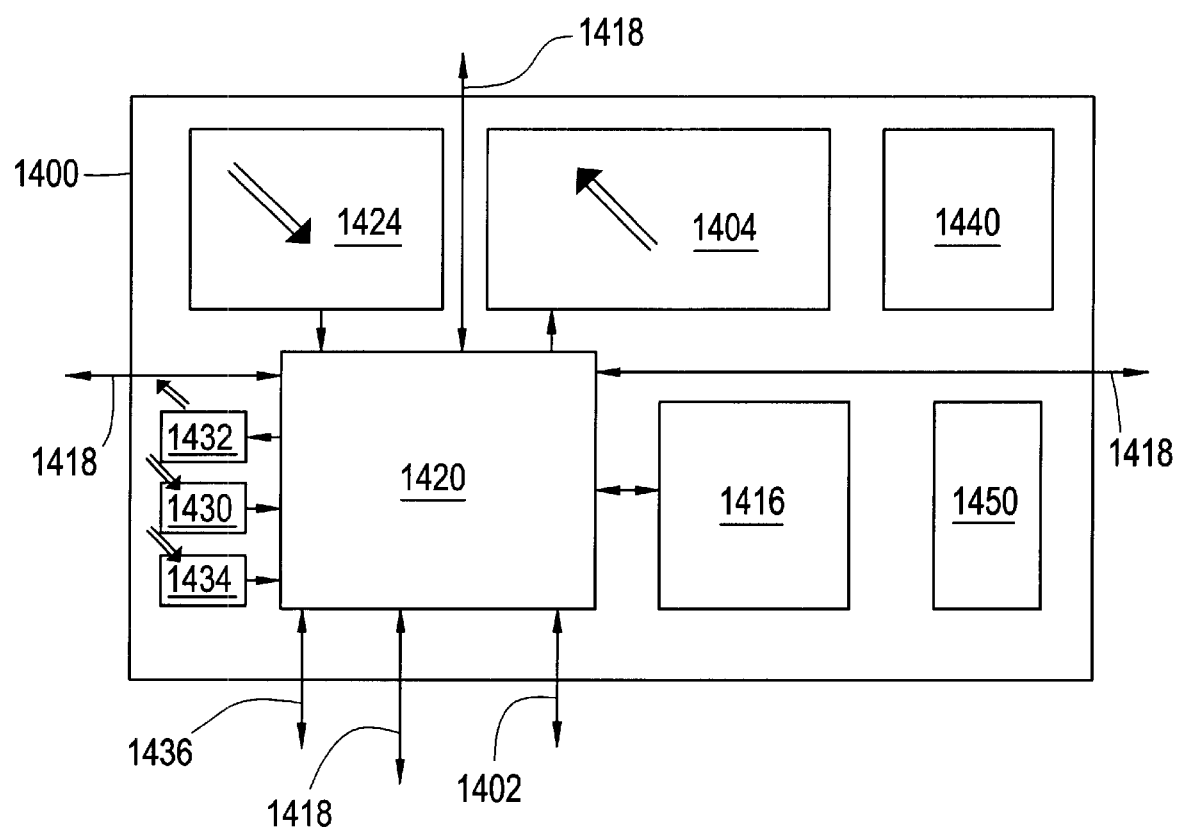
FIG. 14A is a geometric depiction of a direct I/O processing cell with its own power absorption and storage means.
Figure 14B:
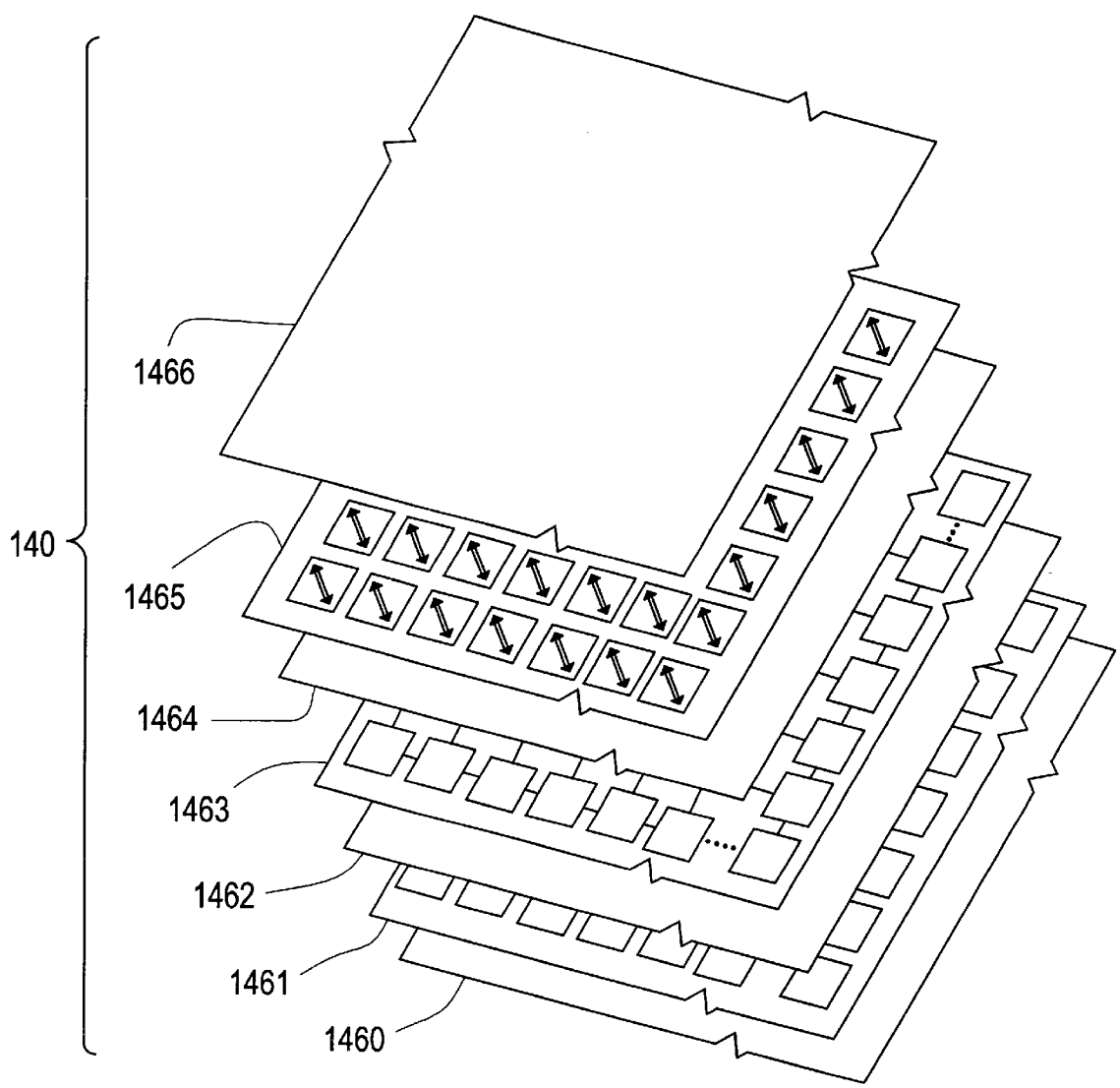
FIG. 14B is a geometric depiction of an array of direct I/O processing cells fabricated as a thin sheet composed of series of thin layers.

In exceptionally preferred embodiments of the present invention, the entire network of cells of any of the embodiments described previously is therefore fabricated as a single thin flexible sheet. This can be achieved by fabricating the array on a thin plastic substrate onto which thin semiconductor and other layers are deposited or transferred. In the example shown in FIGS. 14A and 14B, the data processing system 140 is fabricated as follows: Layer 1460 is smooth sheet of fairly stiff plastic (LEXAN, for example) around 150 microns (6 mils) thick. A thin-film lithium battery layer 1461 400 microns thick is deposited next, followed by a few micron layer of plastic or other insulator, such as sputtered quartz. The battery of single cell 1400 is shown in FIG. 14A as battery 1440. A few micron aluminum power distribution layer 1462 is created next, followed by another insulating layer. A small hole for each cell is etched (or drilled, etc.) through to the power layer, and a vertical "wire" is deposited inside to give the cell access to the power layer. Next the processor/memory layer 1463 is built. A layer of semiconductor material around 50 microns thick is deposited or transferred, and is doped through a low-temperature doping system (such as ion implant) in a manner similar to standard integrated circuit fabrication. Metalized layers are used to connect the elements in the processor/memory layer in the standard integrated circuit chip manner (except for connections to power and ground). This layer contains the bulk of the cells' circuitry, including input and output means 1402 to a global data bus, means 1418 for communication with neighboring cells, memory 1416, and processor 1420, and optional means 1436 to join a regional data bus. Next a layer of insulator is deposited everywhere except where connections to the ground layer will go. The ground layer 1464 is created in the same manner as the power layer 1462. Holes are "drilled" through to contacts in the processor/memory layer and insulated vertical "wires" are deposited inside these holes to give the processor/memory layer 1463 access to the direct I/O layer 1465. This directory layer 1465 is added next, with the direct optical outputs 1404 fabricated in a manner similar to any of those used in making a pixels on a flat-panel portable computer display, the direct optical inputs 1424 fabricated in a manner similar to that used in making a CCD input chip, and the touch/proximity direct inputs 1430 fabricated as miniature standard capacitance touch/proximity detectors. All of these techniques are well known in the art. This layer can also contain sonic output means 1432 and sonic input means 1434. The top layer 1466 is a clear protective layer—100 microns of LEXAN (polycarbonate) provides scratch resistance and brings the total thickness up to around 800 microns, or 0.8 mm. Thus the entire system 140 in this implementation is a stiff but not brittle sheet under a millimeter thick. When using continuous production techniques a large sheet built according to the present embodiment would be diced into a series of smaller sheets, with credit-card sized systems and 8½×11 systems expected to be exceptionally useful.

Small systems built this way should also be perfect for virtual reality glasses. Consider a current computer system with desk-top metaphor software such as MS Windows, OS/2, System 7, etc. The "desktop" space is limited by the size of a monitor to far less than a real desktop. With this embodiment of the architecture of the present invention, such glasses will have more memory, better resolution, and far more processing power than a current desktop system. Furthermore, the left and right "lenses" can display stereoscopic images, and, if the glasses incorporated means for acceleration or orientation detection, the entire image can shift as the wearer's head turns. This could be used to create a whole "virtual office" metaphor far more useful than the "virtual desktop" metaphor of today's computer systems. The glasses can also include means (such as infrared receivers) for communication with other electronic equipment (such as a data gloves, a keyboard, etc.), or physical connections to an external power supply. Because systems built according to this embodiment are extremely portable, it is advantageous design all of the elements for minimal power consumption (i.e. non-volatile SRAMS instead of DRAMS). While different orderings of the layers can be used, the ordering chosen for this example has some important advantages. The processor/memory layer is sandwiched directly between the power and ground layers for fast and easy access to power, which speeds up processing and reduces power requirements. Also, the ground layer and the power layer shield the sensitive processor/memory layer from external electromagnetic interference.

All examples used in this patent application are to be taken as illustrative and not as limiting. As will be apparent to those skilled in the art, numerous modifications to the examples given above can be made within the scope and spirit of the invention. While flat rectilinear arrays have been shown for simplicity, cells can be connected in triangular, hexagonal, octagonal or other regular configurations (although these are less useful for memory arrays). Such configurations need not be planar—the inner surface of a sphere, for example, can be covered with cells that can communicate optically with any other cell across the sphere without interfering with the rest of the array. It is also possible to use layers of cells with direct connections to input and output elements on the surface, or to use three dimensional arrays of cells where only the surface cells have direct output capabilities. One way to achieve this effect with planar arrays is to have complementary direct inputs and outputs on both faces of the array so that separate arrays can be stacked into a 3-dimensional array processor of incredible speed. Although today's silicon lithography has been used for easy understanding in the examples, the elements in and principles of the present invention are not limited to today's lithography, to silicon, to semi-conductors in general, or even to electronics. An optical processor and memory array could be very conveniently coupled to direct optical inputs and outputs, for example. Nor are the cells' elements limited to binary or even digital systems. A hybrid system where each cell had analog input and analog connections to neighbors in addition to digital processing, memory, and direct output appears to be very promising for real-time vision recognition systems. It is also possible to have more than one processor per cell, such as transputer based cells with separate message passing processors.

Nor are the sizes or quantities used in the examples to be taken as maxima or minima, except where explicitly stated. For example, the disclosed architecture can pack a massively parallel computer into a contact lens and also support a multi-billion-cell array the size of a movie theater screen with equal ease.

I claim:

1. A data processing system on a single substrate comprising:
   a. an array of cells, each said cell having a processor and direct output means sending a direct output signal directly to an external receiver;
   b. a controller responsive to a control signal and connected for communication to each of said cells, said controller using said control signal for returning a respective coordination signal to each said cell;
   wherein each said processor in each said cells uses its respective coordination signal for calculating a transmission delay used for sending said direct output signal, said delay being respective to other cells in said array and coordinating said direct output signals from a plurality of said direct output means to said external receiver.

2. A data processing system as in claim 1, further comprising an internal communication means between said cells and said controller.

3. A data processing system as in claim 2, wherein said communication means comprises a global data bus.

4. A data processing system as in claim 1, wherein said delay comprises a phase delay.

5. A data processing system as in claim 1, wherein said delay comprises a time delay.

6. A data processing system as in claim 1, wherein said delay comprises phase and time delays.

7. A data processing system as in claim 1, wherein said direct output means comprises an optical output means.

8. A data processing system as in claim 1, wherein said direct output means comprises a sonic output means.

9. A data processing system as in claim 1, wherein said direct output means comprises a radiofrequency output means.

10. A data processing system as in claim 1, wherein said direct output means comprises an infrared output means.

11. A data processing system as in claim 1, wherein each said cell further comprises a direct input means receiving a direct input signal directly from an external source, wherein each said processor in said cells uses its respective coordination signal for calculating a reception delay used upon reception of said direct input signal, said delay being respective to other cells in said array and coordinating said direct input signals from said external source to a plurality of said direct input means.

12. A data processing system as in claim 11, further comprising an internal communication means between said cells and said controller.

13. A data processing system as in claim 12, wherein said communication means comprises a global data bus.

14. A data processing system as in claim 11, wherein said delay comprises a phase delay.

15. A data processing system as in claim 11, wherein said delay comprises a time delay.

16. A data processing system as in claim 11, wherein said delay comprises phase and time delays.

17. A data processing system as in claim 11, wherein said direct output and input means comprise optical output and input means respectively.

18. A data processing system as in claim 11, wherein said direct output and input means comprise sonic output and input means respectively.

19. A data processing system as in claim 11, wherein said direct output and input means comprise radiofrequency output and input means respectively.

20. A data processing system as in claim 11, wherein said direct output and input means comprise infrared output and input means respectively.

21. A data processing system on a single substrate comprising:
   a. an array of cells, each said cell having a processor and direct input means receiving a direct input signal directly from an external source;
   b. a controller responsive to a control signal and connected for communication to each of said cells, said controller using said control signal for returning a respective coordination signal to each said cell;
   wherein each said processor in said cells uses its respective coordination signal for calculating a reception delay used upon reception of said direct input signal, said delay being respective to other cells in said array and coordinating said direct input signals from said external source to a plurality of said direct input means.

22. A data processing system as in claim 21, further comprising an internal communication means between said cells and said controller.

23. A data processing system as in claim 21, wherein said communication means comprises a global data bus.

24. A data processing system as in claim 21, wherein said delay comprises a phase delay.

25. A data processing system as in claim 21, wherein said delay comprises a time delay.

26. A data processing system as in claim 21, wherein said delay comprises phase and time delays.

27. A data processing system as in claim 21, wherein said direct input means comprises an optical input means.

28. A data processing system as in claim 21, wherein said direct input means comprises a sonic input means.

29. A data processing system as in claim 21, wherein said direct input means comprises a radiofrequency input means.

30. A data processing system as in claim 21, wherein said direct input means comprises as infrared input means.

31. A method for coordinating direct output signals sent directly from a plurality of direct output means to an external receiver, said method embodied in a data processing system on a single substrate comprising an array of cells, each said cell having a processor and said direct output means, said data processing system further comprising a controller connected for communication to each of said cells, said method comprising:
   a. receiving, at said controller, a control signal;
   b. producing, at said controller, a coordination signal;
   c. sending said coordination signal to said processor;
   d. calculating, at said processor, a transmission delay used for sending said direct output signal, said delay being respective to other cells in said array to thereby coordinate said output signals from a plurality of said direct output means to said external receiver.

32. A method for coordinating direct input signals received directly from an external source to a plurality of direct input means, said method embodied in a data processing system on a single substrate comprising an array of cells, each said cell having a processor and said direct input means, said data processing system further comprising a controller connected for communication to each of said cells, said method comprising:
   a. receiving, at said controller, a control signal;
   b. producing, at said controller, a coordination signal;
   c. sending said coordination signal to said processor;
   d. calculating, at said processor, a transmission delay used when receiving said direct input signal, said delay being respective to other cells in said array to thereby coordinate said direct input signals from said external source to a plurality of said direct input means.

* * * * *